(12) United States Patent
Luby et al.

(10) Patent No.: US 10,001,944 B2
(45) Date of Patent: Jun. 19, 2018

(54) SYSTEMS AND METHODS FOR DATA ORGANIZATION IN STORAGE SYSTEMS USING LARGE ERASURE CODES

(71) Applicant: QUALCOMM Incorporated, San Diego, CA (US)

(72) Inventors: Michael George Luby, Berkeley, CA (US); Thomas Joseph Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 270 days.

(21) Appl. No.: 14/954,792

(22) Filed: Nov. 30, 2015

(65) Prior Publication Data

US 2017/0060469 A1     Mar. 2, 2017

Related U.S. Application Data

(60) Provisional application No. 62/211,332, filed on Aug. 28, 2015.

(51) Int. Cl.
*G11C 29/00*     (2006.01)
*G06F 3/06*      (2006.01)
(Continued)

(52) U.S. Cl.
CPC ............ *G06F 3/0644* (2013.01); *G06F 3/067* (2013.01); *G06F 3/0619* (2013.01);
(Continued)

(58) Field of Classification Search
CPC ...... G06F 3/0644; G06F 3/0619; G06F 3/067; G06F 3/0689; G06F 11/1088;
(Continued)

(56) References Cited

U.S. PATENT DOCUMENTS 8,856,619 B1   10/2014  Cypher
8,972,478 B1    3/2015  Storer et al.
(Continued)

FOREIGN PATENT DOCUMENTS

| CN | 103513942 A | 1/2014 |
|---|---|---|
| EP | 2725491 A1 | 4/2014 |
| WO | WO-2012147087 A1 | 11/2012 |

OTHER PUBLICATIONS

Mager et al. "A Measurement Study of the Wuala On-line Service," 2012.*

(Continued)

*Primary Examiner* — Guy Lamarre
(74) *Attorney, Agent, or Firm* — Norton Rose Fulbright LLP

(57) ABSTRACT

Systems and methods which implement one or more data organization techniques that facilitate efficient access to source data stored by a storage system are disclosed. Data organization techniques implemented according to embodiments are adapted to optimize (e.g., maximize) input/output efficiency and/or (e.g., minimize) storage overhead, while maintaining mean time to data loss, repair efficiency, and/or traffic efficiency. Data organization techniques as may be implemented by embodiments include blob based organization techniques, grouped symbols organization techniques, data ordering organization techniques, and combinations thereof.

100 Claims, 16 Drawing Sheets

(51) Int. Cl.
  *G06F 11/10* (2006.01)
  *H03M 13/15* (2006.01)
  *H03M 13/29* (2006.01)

(52) U.S. Cl.
  CPC ........ *G06F 3/0689* (2013.01); *G06F 11/1076* (2013.01); *G06F 11/1088* (2013.01); *H03M 13/154* (2013.01); *H03M 13/2906* (2013.01); *G06F 3/0638* (2013.01)

(58) Field of Classification Search
  CPC .............. G06F 3/0638; G06F 11/1076; H03M 13/154; H03M 13/2906
  See application file for complete search history.

(56) References Cited

U.S. PATENT DOCUMENTS

| | | |
|---|---|---|
| 9,021,296 B1 | 4/2015 | Kiselev et al. |
| 9,280,416 B1 | 3/2016 | Xin et al. |
| 9,430,443 B1* | 8/2016 | Jensen ................ H03M 13/1174 |
| 2010/0064166 A1 | 3/2010 | Dubnicki et al. |
| 2010/0185919 A1* | 7/2010 | Lawson ................ H04L 1/0061 714/758 |
| 2014/0052706 A1* | 2/2014 | Misra ................ G06F 17/30194 707/698 |
| 2014/0129881 A1 | 5/2014 | De et al. |
| 2015/0100860 A1 | 4/2015 | Lee et al. |
| 2015/0134825 A1* | 5/2015 | Alshinnawi ............ H04L 43/08 709/226 |
| 2015/0277969 A1 | 10/2015 | Strauss et al. |
| 2015/0278397 A1 | 10/2015 | Hendrickson et al. |
| 2017/0060683 A1 | 3/2017 | Luby et al. |

OTHER PUBLICATIONS

Mager T., et al., "A Measurement Study of the Wuala On-line Storage Service," IEEE 12th International Conference on Peer-to-Peer Computing (P2P), 2012, 10 pages.

International Search Report and Written Opinion—PCT/US2016/039594—ISA/EPO—dated Sep. 30, 2016.

Anonymous: "Data cluster—Wikipedia," Jan. 10, 2015 (Jan. 10, 2015), XP055394016, Retrieved from the Internet: URL:https://en.wikipedia.org/w/index.php?title=Data_cluster&oldido641934697 [retrieved on Jul. 26, 2017].

* cited by examiner

SYSTEMS AND METHODS FOR DATA ORGANIZATION IN STORAGE SYSTEMS USING LARGE ERASURE CODES

CROSS-REFERENCE TO RELATED APPLICATIONS

This application claims the benefit of U.S. Provisional Patent Application No. 62/211,332 entitled, "SYSTEMS AND METHODS FOR DATA ORGANIZATION IN STORAGE SYSTEMS USING LARGE ERASURE CODES", filed on Aug. 28, 2015, which is expressly incorporated by reference herein in its entirety

DESCRIPTION OF THE RELATED ART

The creation, management, storage, and retrieval of electronic data has become nearly ubiquitous in the day-to-day world. Such electronic data may comprise various forms of information, such as raw data (e.g., data collected from sensors, monitoring devices, control systems, etc.), processed data (e.g., metrics or other results generated from raw data, data aggregations, filtered data, etc.), produced content (e.g., program code, documents, photographs, video, audio, etc.), and/or the like. Such data may be generated by various automated systems (e.g., network monitors, vehicle on-board computer systems, automated control systems, etc.), by user devices (e.g., smart phones, personal digital assistants, personal computers, digital cameras, tablet devices, etc.), and/or a number of other devices.

Regardless of the particular source or type of data, large quantities of electronic data are generated, stored, and accessed every day. Accordingly sophisticated storage systems, such as network attached storage (NAS), storage area networks (SANs), and cloud based storage (e.g., Internet area network (IAN) storage systems), have been developed to provide storage of large amounts of electronic data. Such storage systems provide a configuration in which a plurality of storage nodes are used to store the electronic data of one or more users/devices, and which may be stored and retrieved via one or more access servers.

FIG. 1A shows an exemplary implementation of storage system 100A in which access server 110 is in communication with end user (EU) device 120 to provide storage services with respect thereto. Access server 110 may comprise one or more servers operable under control of an instruction set to receive data from devices such as EU device 120, and to control storage of the data and to retrieve data in response to requests from devices such as EU device 120. Accordingly, access server 110 is further in communication with a plurality, M, of storage nodes (shown here as storage nodes 130-1 through 130-M). Storage nodes 130-1 through 130-M may comprise a homogeneous or heterogeneous collection or array (e.g., redundant array of independent disks (RAID) array) of storage media (e.g., hard disk drives, optical disk drives, solid state drives, random access memory (RAM), flash memory, etc.) providing persistent memory in which the electronic data is stored by and accessible through access server 110. Each such storage node may be, for example, a commodity web server. Alternatively, in some deployments at least some storage nodes may be personal devices interconnected over the Internet. EU device 120 may comprise any configuration of device which operates to generate, manage, and/or access electronic data. It should be appreciated that although only a single such device is shown, storage system 100A may operate to serve a plurality of devices, some or all of which may comprise devices in addition to or in the alternative to devices characterized as "end user" devices.

FIG. 1B shows an exemplary implementation of storage system 100B in which access servers 110-1 through 110-14 may communicate with one or more EU devices of EU devices 120-1 through 120-3 to provide storage services with respect thereto. It should be appreciated that storage system 100B shows an alternative configuration to that of 100A discussed above wherein, although the access servers, EU devices, and storage nodes may be embodied as described above, the storage nodes of storage system 110B are deployed in a cluster configuration, shown as storage node cluster 130. In operation of storage system 100B, a cluster of access servers have access to the cluster of storage nodes. Thus, the EU devices may connect in a variety of ways to various access servers to obtain data services. In some cases, the access servers may be distributed around the country such that no matter where the EU device is located it may access the data stored in the storage node cluster. Storage nodes of such a configuration may be distributed geographically as well.

Source blocks of electronic data are typically stored in storage systems such as storage systems 100A and 100B as objects. Such source blocks, and thus the corresponding objects stored by the storage systems, may comprise individual files, collections of files, data volumes, data aggregations, etc. and may be quite large (e.g., on the order of megabytes, gigabytes, terabytes, etc.). The objects are often partitioned into smaller blocks, referred to as fragments (e.g., a fragment typically consisting of a single symbol), for storage in the storage system. For example, an object may be partitioned into k equal-sized fragments (i.e., the fragments comprise blocks of contiguous bytes from the source data) for storage in storage systems 100A and 100B. Each of the k fragments may, for example, be stored on a different one of the storage nodes.

In operation, storage systems such as storage systems 100A and 100B are to provide storage of and access to electronic data in a reliable and efficient manner. For example, in a data write operation, access server 110 may operate to accept data from EU device 120, create objects from the data, create fragments from the objects, and write the fragments to some subset of the storage nodes. Correspondingly, in a data read operation, access server 110 may receive a request from EU device 120 for a portion of stored data, read appropriate portions of fragments stored on the subset of storage nodes, recreate the object or appropriate portion thereof, extract the requested portion of data, and provide that extracted data to EU device 120. However, the individual storage nodes are somewhat unreliable in that they can intermittently fail, in which case the data stored on them is temporarily unavailable, or permanently fail, in which case the data stored on them is permanently lost (e.g., as represented by the failure of storage node 130-2 in FIG. 1C).

Erasure codes (e.g., tornado codes, low-density parity-check codes, Reed-Solomon coding, and maximum distance separable (MDS) codes) have been used to protect source data against loss when storage nodes fail. When using an erasure code, such as MDS erasure codes, erasure encoding is applied to each source fragment (i.e., the k fragments into which an object is partitioned) of an object to generate repair data for that fragment, wherein the resulting repair fragments are of equal size with the source fragments. In operation of the storage system, the source fragments and corresponding repair fragments are each stored on a different one of the storage nodes.

The erasure code may provide r repair fragments for each source object, whereby the total number of fragments, n, for a source object may be expressed as n=k+r. Thus, the erasure code may be parameterized as (n; k; r) where k is the number of source symbols in a source block, n is the total number of encoded symbols, and r=n−k is the number of repair symbols. A property of MDS erasure codes is that all k source symbols can be recovered from any k of the n encoded symbols (i.e., the electronic data of the source block may be retrieved by retrieving any combination (source and/or repair fragments) of k fragments. Although providing data reliability, it should be appreciated that where desired data is not directly available (e.g., a fragment is unavailable due to a failed storage node), to recreate the missing data k fragments must be accessed to recreate the missing data (i.e., k times the amount of data must be accessed to recreate the desired but missing data). This can result in inefficiencies with respect to the use of resources, such as communication bandwidth, computing resources, etc.

In providing reliable storage of the electronic data, storage systems such as storage systems 100A and 100B implementing erasure coding of the data (e.g., access server 110 of FIG. 1C operational to provide repair server functionality) have a repair process or policy running in the background to determine the number of fragments available with respect to the objects (e.g., to detect objects which are missing one or more fragments, such as due to a failed storage node). For objects with some level of missing fragments (e.g., as the number of available fragments approaches k) logic of the storage system repair process will read k remaining fragments for that object and recreate the object and write additional fragments to the storage system (e.g., on other of the storage nodes which remain available). Typically, the objects for which the fewest fragments are available are the ones that are repaired first, before objects that have more fragments available (assuming an equal number of fragments for the objects), according to such repair policies.

It should be appreciated that, although the example of FIG. 1C illustrates a repair server as being implemented by access server 110, repair servers operable to provide repair services herein may be provided in various configurations. For example, one or more repair servers may be provided separately from access servers of a storage system according to embodiments. As another example, repair servers and or access servers may be implemented by storage nodes 130-1 through 130-M.

The aforementioned intermittent node failures are far more typical than permanent node failures (e.g., 90% of the node failures are intermittent), and the repair policy is not needed to recover the data that is temporarily unavailable on these nodes as eventually this data will become available again when the node comes back online. Accordingly, when fragments become unavailable the repair process may detect and delay repairing the data for some period of time, T (e.g., intermittent failure threshold time), to determine whether the failure is intermittent or permanent.

The erasure code solutions that have been implemented with respect to storage systems have been small erasure code solutions due to their suitability for relatively rapid recreation of missing source data. An (n; k; r) erasure code solution is said to be a small erasure code solution if n<<M (i.e., for each source object there are fragments at a small fraction of the storage nodes). Such a small erasure code configuration (e.g., k=10) generally comprises a correspondingly small number of repair fragments (e.g., r=4, thus n=14). Accordingly, for a small erasure code solution it is beneficial to use a reactive repair policy (i.e., when a fragment of an object is lost due to a permanent node failure then the repair policy immediately or as quickly as possible replaces the lost fragment with another fragment in light of the total number of fragments, n, being so near the minimum number of fragments, k, needed to recover the data). Because a large amount of data is stored on each node (typically many terabytes), and all data comprising fragments stored on a node typically needs to be replaced when the node permanently fails, the repair process reads and writes a large amount of data after a node permanently fails. This reading and writing of large amounts of data generally results in the consumption of large amounts of bandwidth in the storage system by the repair policy and, when coupled with a reactive repair policy, can result in disruptive spikes in storage system bandwidth utilization (e.g., delaying or preventing primary data access services by the storage system). That is, the repair policy implemented with respect to a small erasure code configuration may act somewhat erratically whereby it utilizes a large amount of bandwidth for periods of time when attempting to repair data immediately upon determining fragments are unavailable due to a permanently failed node. Furthermore, the repair process may not be able to repair fragments fast enough before further node failures lead to permanent loss of object data if not enough bandwidth is allocated to the repair process.

SUMMARY

A method implemented by processor-based logic of a storage system storing source data as a plurality of erasure coded fragments on storage nodes of the storage system is provided according to embodiments herein. The method includes obtaining storage device metric values for a storage node configuration of a plurality of storage nodes of the storage nodes of the storage system. Embodiments of the method further include implementing, by the logic of the storage system, data coding parameter values for storing the source data on the plurality of storage nodes using an erasure code based at least in part on the storage device metric values to provide the erasure coded fragments adapted for input/output (I/O) access efficiency in the storage system.

An apparatus for storing source data as a plurality of erasure coded fragments on storage nodes of a storage system is provided according to further embodiments herein. The apparatus of embodiments includes one or more data processors and one or more non-transitory computer-readable storage media containing program code configured to cause the one or more data processors to perform particular operations. The operations performed according to embodiments include obtaining storage device metric values for a storage node configuration of a plurality of storage nodes of the storage nodes of the storage system. The operations performed according to embodiments further include implementing data coding parameter values for storing the source data on the plurality of storage nodes using an erasure code based at least in part on the storage device metric values to provide the erasure coded fragments adapted for input/output (I/O) access efficiency in the storage system.

An apparatus for storing source data as a plurality of erasure coded fragments on storage nodes of a storage system according to still further embodiments herein. The apparatus of embodiments includes means for obtaining storage device metric values for a storage node configuration of a plurality of storage nodes of the storage nodes of the storage system. The apparatus of embodiments further includes means for implementing data coding parameter values for storing the source data on the plurality of storage nodes using an erasure code based at least in part on the storage device metric values to provide the erasure coded fragments adapted for input/output (I/O) access efficiency in the storage system.

A non-transitory computer-readable medium comprising codes for storing source data as a plurality of erasure coded fragments on storage nodes of a storage system is provided according to yet further embodiments herein. The codes of embodiments cause the computer to obtain storage device metric values for a storage node configuration of a plurality of storage nodes of the storage nodes of the storage system. The codes of embodiments further cause a computer to implement data coding parameter values for storing the source data on the plurality of storage nodes using an erasure code based at least in part on the storage device metric values to provide the erasure coded fragments adapted for input/output (I/O) access efficiency in the storage system.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
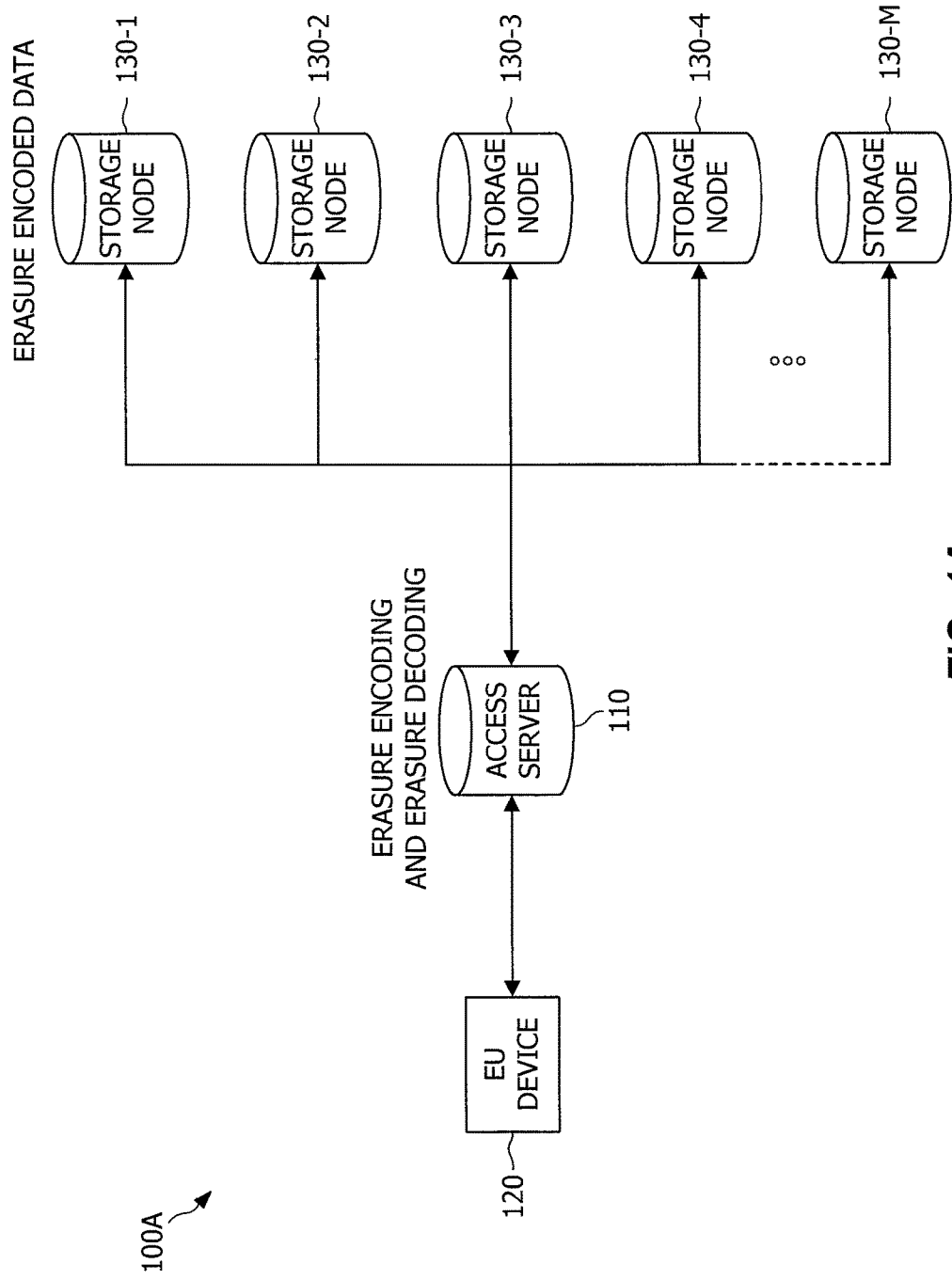
FIGS. 1A and 1B show exemplary implementations of storage systems as may be adapted to provide storage system data organization according to embodiments of the present disclosure.
Figure 1B:
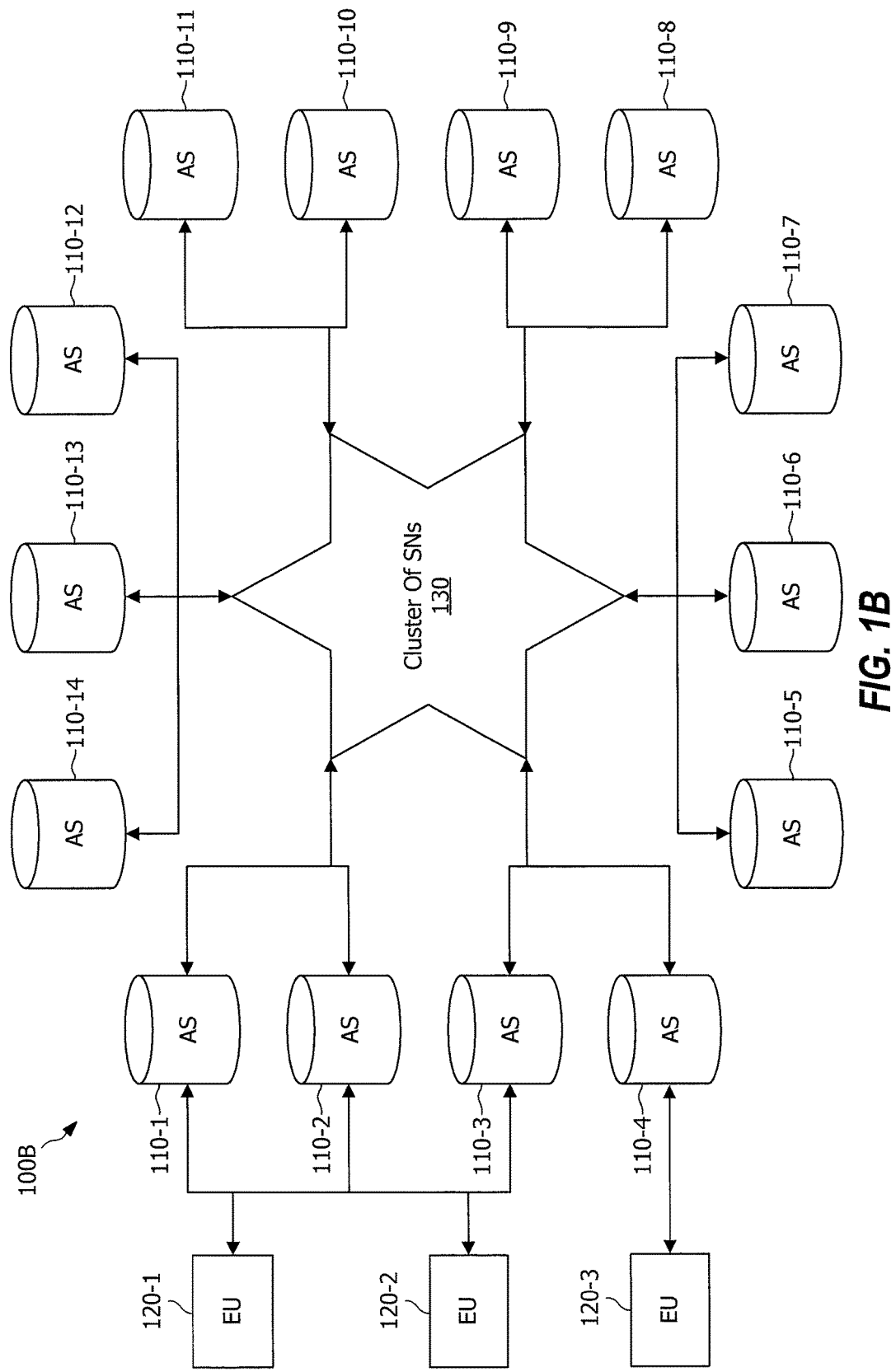
Figure 1C:
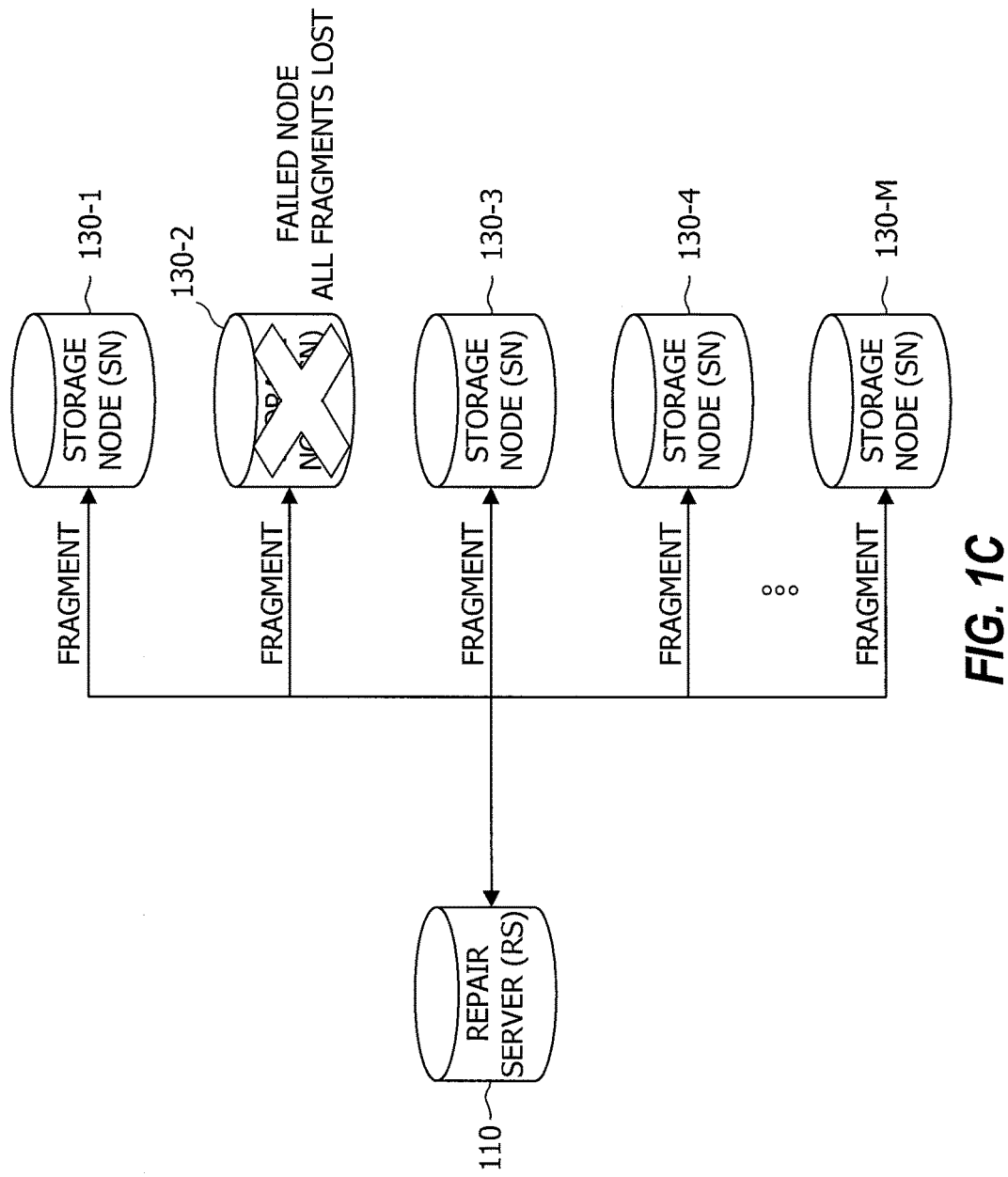
FIG. 1C shows failure of a storage node as may be experienced in the storage systems of FIGS. 1A and 1B.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the terms "data" and "electronic data" may include information and content of various forms, including raw data, processed data, produced content, and/or the like, whether being executable or non-executable in nature. Such data may, for example, include data collected from sensors, monitoring devices, control systems, metrics or other results generated from raw data, data aggregations, filtered data, program code, documents, photographs, video, audio, etc. as may be generated by various automated systems, by user devices, and/or other devices.

As used in this description, the term "fragment" refers to one or more portions of content that may be stored at a storage node. For example, the data of a source object may be partitioned into a plurality of source fragments, wherein such source objects may comprise an arbitrary portion of source data, such as a block of data or any other unit of data including but not limited to individual files, collections of files, data volumes, data aggregations, etc. The plurality of source fragments may be erasure encoded to generate one or more corresponding repair fragments, whereby the repair fragment comprises redundant data with respect to the source fragments. The unit of data that is erasure encoded/decoded is a source block, wherein k is the number of source symbols per source block, Bsize is the source block size, Ssize is the symbol size (Bsize=k·Ssize), n is the number of encoded symbols generated and stored per source block, and r is the number of repair symbols (r=n−k), and wherein the symbol is the atomic unit of data for erasure encoding/decoding. Although the symbol size (Ssize) may be different for different source blocks, the symbol size generally remains the same for all symbols within a source block. Similarly, although the number of source symbols (k), the number of repair symbols (r), and the number of encoded symbols generated may be different for different source blocks, the values generally remain the same for all source blocks of a particular object. Osize is the size of the source object and Fsize is the size of the fragment (e.g., where k is both the number of source symbols per source block and the number of fragments per source object, Osize=k·Fsize).

As used in this description, the terms "component," "database," "module," "system," "logic" and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," "end user device," and "client device" include devices capable of requesting and receiving content from a web server or other type of server and transmitting information to a web server or other type of server. In some cases, the "user equipment," "user device," "end user device," or "client device" may be equipped with logic that allows it to read portions or all of fragments from the storage nodes to recover portions or all of source objects. Such devices can be a stationary devices or mobile devices. The terms "user equipment," "user device," "end user device," and "client device" can be used interchangeably.

As used herein, the term "user" refers to an individual receiving content on a user device or on a client device and transmitting information or receiving information from to a website or other storage infrastructure.

Embodiments according to the concepts of the present disclosure provide solutions with respect to storing and accessing source data in a reliable and efficient manner within a storage system of unreliable nodes (i.e., nodes that can store data but that can intermittently fail, in which case the data stored on them is temporarily unavailable, or permanently fail, in which case the data stored on them is permanently lost). In particular, embodiments herein provide methodologies, as may be implemented in various configurations of systems and methods, for reliably storing data and/or facilitating access to data within a storage system using fragment encoding techniques other than Maximum Distance Separable (MDS) codes, such as may utilize large erasure codes (e.g., RAPTOR Forward Error Correction (FEC) code as specified in IETF RFC 5053, and RAPTORQ Forward Error Correction (FEC) code as specified in IETF RFC 6330, of which software implementations are available from Qualcomm Incorporated). Although, large erasure codes have generally not been considered with respect to solutions for reliably and efficiently storing and accessing source data within a storage system of unreliable nodes due to potential demands on repair bandwidth and potential inefficient access when the desired data is not directly available, embodiments described in U.S. patent application Ser. Nos. 14/567,203, 14/567,249, and 14/567,303, each entitled "SYSTEMS AND METHODS FOR RELIABLY STORING DATA USING LIQUID DISTRIBUTED STORAGE," each filed Dec. 11, 2014, the disclosures of which are hereby incorporated herein by reference, utilize a lazy repair policy (e.g., rather than a reactive, rapid repair policy as typically implemented by systems implementing a short erasure code technique) to control the bandwidth utilized for data repair processing within the storage system. The large erasure code storage control of embodiments operates to compress repair bandwidth (i.e., the bandwidth utilized within a storage system for data repair processing) to the point of operating in a liquid regime (i.e., a queue of items needing repair builds up and the items are repaired as a flow), thereby providing large erasure code storage control in accordance with concepts herein.

In some embodiments, repair can be executed in such a way that if a first object has less available fragments than a second object, then the set of ESIs associated with the available fragments for the first object is a subset of the set of ESIs associated with the available fragments for the second object, i.e., all the available fragments for the first object are in common with the available fragments for the second object, and thus the ESIs of the available fragments for the first object are nested within the ESIs of the available fragments for the second object, in which case the available fragments for the first source object are referred to herein as commonly available for the first and second source objects. In this case, if an object with the least number of available fragments is decodable (recoverable) then all other objects are decodable (recoverable), and thus decodability of all the objects can be verified by verifying that decoding is possible from the (unique) set of ESIs associated with an object with the least number of available fragments, since all of the fragments available for an object with the least number of available fragments are common to the set of available fragments for any other object. More generally stated, a set of fragments is commonly available for a set of one or more source objects if each fragment in the set of fragments (e.g., as identified by its ESI) is available for each source object in the set of source objects. Thus, even if the ESIs for a set of source objects do not have the nesting property described above, a set of commonly available fragments for the set of source objects may still be determined and used to verify decodability of all source objects in the set of source objects. For example, a first source object may have available fragments identified by ESIs 0, 1, 2, 3, 4, 5, 6, whereas a second source object may have available fragments identified by ESIs 2, 3, 4, 5, 6, 7, 8, and thus even though this pair of source objects do not have the nesting property described above, the commonly available fragments for this pair of source objects can be identified by the ESIs 2, 3, 4, 5, 6, and if decodability is possible using only these commonly available fragments then decoding is possible for both source objects. Thus verifying decodability with respect to a set of commonly available fragments (e.g., based on their ESIs) can be used to verify decodability of all source objects in the set of source objects.

It should be appreciated that there are various metrics by which to evaluate a storage system solution. Such metrics include reliability, storage efficiency, repair bandwidth efficiency, and access efficiency.

Reliability provides a measure of the amount of time that all source data can be stored without loss of any of the data. Reliability is usually measured as a mean time to source data loss, and typically measured in years. The reliability metric used in accordance with some embodiments herein is the mean time to loss of any source data, or mean time to data loss (MTTDL). MTTDL is sometimes estimated, for example, by calculating a mean time to loss of a particular piece of source data and multiplying that metric by the number of pieces of source data in the storage system. However, the accuracy of this estimate method relies upon the assumption that each piece of source data is lost independently of other pieces, and this assumption may not be true for some systems.

Storage efficiency provides a measure of the fraction of the available storage within the storage system that can be used to store source data. Storage efficiency ($\alpha$) measures the ratio of the total size of source objects in the system to the total target amount of data used to store the source objects, and the storage overhead or storage redundancy ($\beta$) is $1-\alpha$. That is, storage overhead or storage redundancy is the ratio of the total target amount of repair data for all objects divided by the total target amount of source and repair data for all objects in the storage system when using a systematic erasure code to store the objects. Thus, the storage overhead is the target fraction of the used storage that is not for source data. The storage efficiency ($\alpha$), being the target fraction of storage usable for source data, may thus be represented in terms of the storage overhead as $\alpha=1-\beta$.

Repair bandwidth efficiency provides a measure of the amount of network bandwidth used for repairing lost data from failed storage nodes. It should be appreciated that repair bandwidth may be a shared resource with the access bandwidth and/or storage bandwidth (e.g., each taken from the available data communication bandwidth). Accordingly, an upper bound on the repair bandwidth (R) may be provided according to embodiments herein.

The ratio of an amount of data that is read from storage nodes to a resulting amount of repair data that is generated and stored on storage nodes is one measure of repair bandwidth efficiency. Accordingly, repair bandwidth efficiency may be measured by the ratio of the number of fragments that need to be read to decode the source data to the number of fragments that are generated for the repair. Thus, the larger the number of fragments generated for a particular source object by the repair process, the higher the repair bandwidth efficiency.

Access efficiency provides a measure of the amount of data that needs to be read from the storage system to retrieve a given portion of source data (e.g., f(A) is the amount of read data from the storage nodes to access A bytes of source data, wherein when f(A) is greater than A the data access is inefficient). It should be appreciated that the amount of time to access source data is related to the access efficiency. Accordingly, when the amount of data read from the storage nodes to access a particular portion of source data is larger than that portion of source data, not only is more bandwidth than minimally necessary used to access the data but the amount of time it takes to access the source data can be longer than minimally necessary. Accordingly, embodiments herein are adapted to provide implementations wherein very nearly f(A)=A.

Permanent failure of the nodes is often modeled by a Poisson process parameterized by $\lambda$, which denotes the failure rate of each node according to an exponential distribution. There are also intermittent failures of nodes (e.g., a node that is not available for some small interval of time but which comes back online and is fully available again). As previously mentioned, such intermittent node failures are far more typical than permanent node failures. Accordingly, a repair policy is not needed to recover the data temporarily unavailable on these nodes as eventually this data will become available again when the node comes back online and thus when nodes fail there is some period of time, as may be denoted by an intermittent failure threshold, T, until it is determined whether the failure is intermittent or permanent. Nodes can be added to the storage system to replace nodes that have failed permanently. When replacement nodes are available for permanently failed nodes, the repair policy can repair an object that has lost fragments on failed nodes by reading fragments for the object from other nodes, erasure decode the object from the read fragments, erasure encode additional fragments from the object, and store these additional fragments on replacement nodes.

The repair bandwidth metric, R, utilized according to some embodiments of the present disclosure is an amount of bandwidth provisioned to be used by the repair policy to ensure a provided MTTDL, whereby the repair policy may use this amount of repair bandwidth at each point in time, or more generally the repair policy may use this amount of repair bandwidth when averaged over a longer window of time. The repair bandwidth provisioned to the repair process may be respected on an instantaneous basis (i.e., the repair process may use repair bandwidth at a steady rate that is at or below the provisioned repair bandwidth). Alternatively, the repair bandwidth provisioned to the repair process may be considered as an average over a long window of time that is sufficient for the repair process to achieve a provisioned MTTDL, and thus the repair process may decide to use the repair bandwidth in, for example, a scheduled manner independent of the timing of storage node failures. For example, the repair process may be scheduled to run periodically for an hour or two each day, for a few hours each week, or for a few hours each month or couple of months, such that the average repair bandwidth used by the repair process over these windows of times averages to the provisioned repair bandwidth.

The repair policy may use such a provisioned repair bandwidth in a way that avoids interference with other processes sharing the same bandwidth resources, such as an access process that is accessing data stored on the storage nodes, or a storage process that is storing data to the storage nodes. For example, the repair policy may detect that another process needs to use a significant part of the shared bandwidth for some period of time, and the repair process may suspend or significantly slow down its usage of repair bandwidth during this period of time and then use more repair bandwidth again after the other processes bandwidth needs have reduced. In this example, the repair policy is essentially running as a background process with respect to bandwidth consumption (e.g., the repair policy backs off on its usage of bandwidth in response to other processes increased bandwidth usage). As another example, the repair policy may have scheduled times when it uses repair bandwidth, and refrain from using repair bandwidth at other times, wherein the scheduled times of repair bandwidth usage are for example times when other processes that share the bandwidth resources are typically quiescent (e.g., the repair process uses repair bandwidth from 1 A.M. to 3 A.M. each morning when there is very little access or storage activity within the storage system). In these cases, the usage of repair bandwidth by the repair server is largely independent of the timing of data loss within the storage system (e.g., the timing of permanent or intermittent storage node failures).

The access efficiency metric may be considered with respect to a plurality of situations. For example, the access efficiency metric may be considered with respect to the case where there are no node failures (intermittent or permanent) amongst the storage nodes that are used to store the source data, and the case where there are node failures (intermittent or permanent) amongst the storage nodes that are used to store the source data. The amount of data read from storage nodes in order to access a chunk of source data is an important component of access efficiency because this largely determines the speed at which a chunk can be accessed. Ideally, the amount of data read to access a chunk should be equal to the size of the chunk.

Previous solutions for storing and accessing source data within a storage system have primarily focused on using a reactive repair policy with respect to data determined to be unavailable. In operation according to such reactive repair policies, data is scheduled for repair as soon as any data is lost on a permanently failed node, and as much bandwidth as necessary is used to perform the repair in a burst. A Markov chain analysis is typically applied to individual objects in the storage system for the reliability analysis of a reactive repair policy. The analysis assumes that the number of objects that need repair is always nearly zero, which is justified if the repair policy can always work quickly enough.

With a reactive repair policy, the overall amount of repair traffic generated is proportional to at least k+1 times the amount of data lost on permanently failed nodes, where k is the number of source symbols used by the erasure code. This is because each time a fragment of an object is lost on a permanently failed node, at least k fragments for that object are read by the repair policy to generate at least one repair fragment that is stored on replacement nodes.

Large erasure code solutions in combination with a lazy repair policy achieve better trade-offs in storage efficiency, repair bandwidth efficiency, and reliability than is possible for any small erasure code solution. In particular, the use of a large erasure code according to embodiments provides a number of advantages, such as advantages associated with spreading the data for a particular object over many nodes and providing improved repair and access properties. Such large erasure codes that are not inherently MDS cannot, however, guarantee code performance. That is, although large erasure codes provide very high data recovery reliability of a source object from k fragments (e.g., in the range of 99%), recovery is nevertheless not guaranteed. The use of some additional number of fragments, x, increases recovery reliability (e.g., source object data recovery using k+x fragments, where x =1 provides data recovery in the range of 99.99% and where x=2 provides data recovery in the range of 99.9999%). However, no amount, x, of additional fragments may be sufficient to guarantee recovery of the source data. Nevertheless, embodiments utilizing large erasure codes provide smoothness and efficiency of repair bandwidth, wherein efficiency may arise from an overhead operating point implemented and diminishing efficiency returns may be realized from operating near k available fragments. Additionally, embodiments realize improved accessibility through operating with a minimum redundancy, Y, (e.g., a minimum number of available redundancy fragments) providing network and device multiplexing gains on latency, wherein accessibility is benefited from a larger number of available redundancy fragments. Moreover, the large erasure codes utilized according to embodiments provides good, albeit probabilistic, data recovery performance along with superior encoding and decoding performance (as compared to small erasure codes).

Figure 2A:
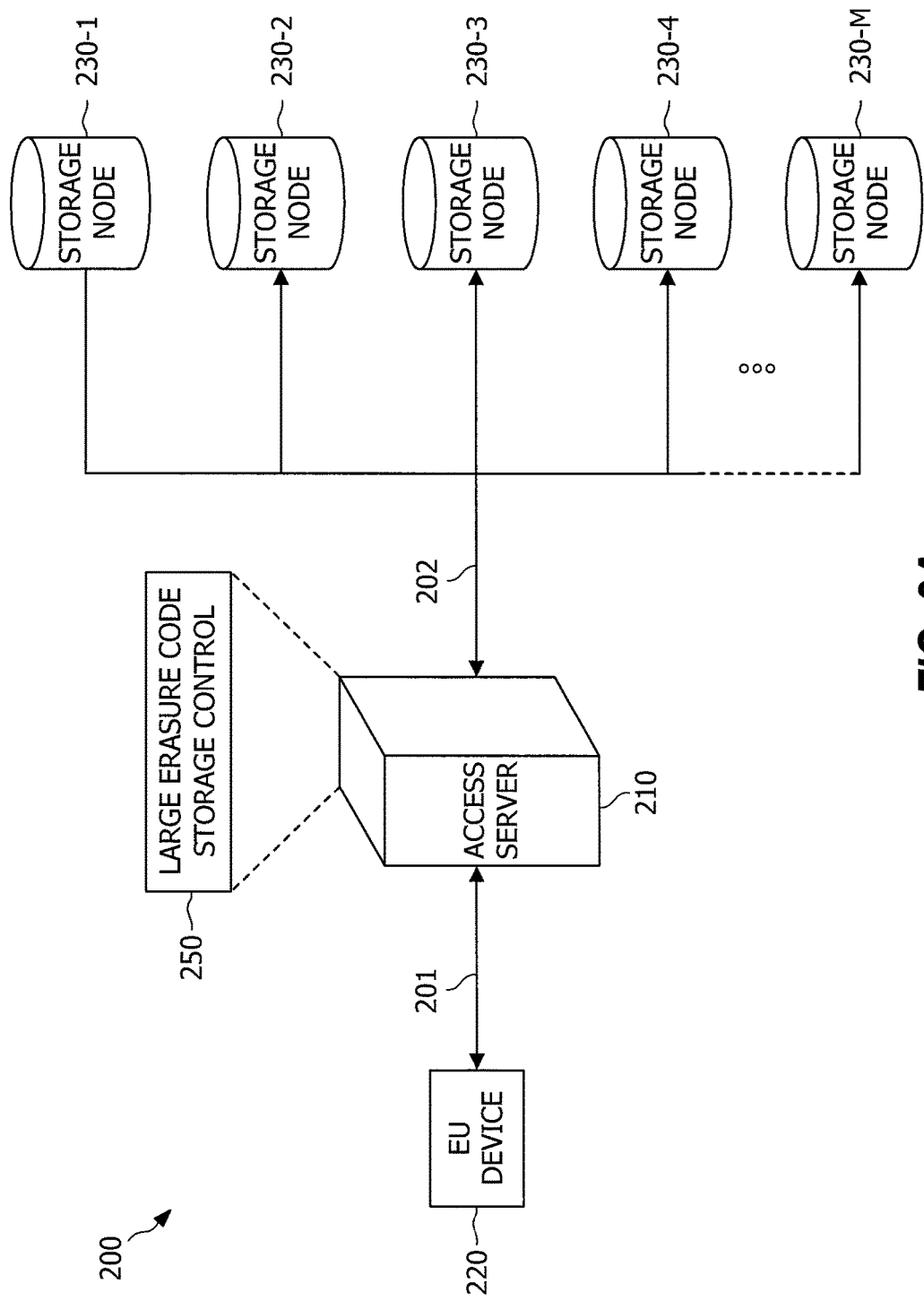
FIGS. 2A and 2B show detail with respect to exemplary implementations of storage systems adapted to provide storage system data organization according to embodiments of the present disclosure.
Figure 2B:
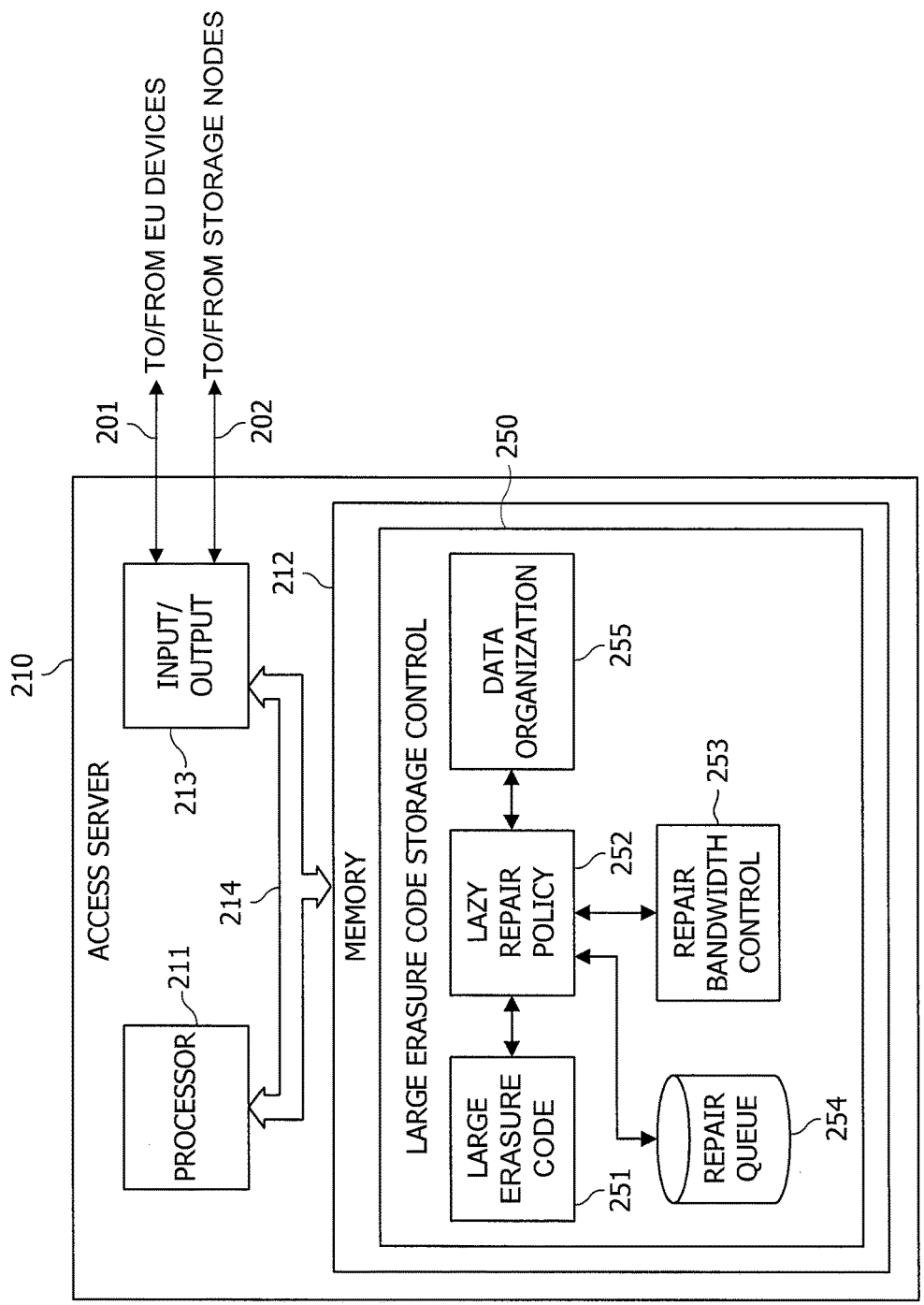

FIGS. 2A and 2B show storage system 200 adapted to provide large erasure code storage control according the concepts disclosed herein. Large erasure code storage control according to embodiments provides forward checking of data integrity, such as to assure that the objects most susceptible to failure (e.g., the objects having the fewest fragments remaining, objects having fragments stored on nodes having a higher failure rate, etc.) can still be recovered when a certain number of additional fragments are lost. For example, forward checking of data integrity may perform a real-time or near real-time check that a certain number of additional storage node failures (e.g., 5) can be tolerated without any objects becoming unrecoverable. That is, embodiments operate to prospectively analyze fragment losses with respect to one or more source objects, such as to determine the susceptibility of the storage system to source data loss.

Large erasure control according to embodiments additionally or alternatively provides operation to maintain a minimum redundancy with respect to the fragments stored by the system. For example, the repair bandwidth, R, may be provisioned or otherwise controlled to maintain a minimum redundancy, Y, in the system (e.g., maintain Y=0.1·k, Y=0.2·k, etc.). Accordingly, the repair bandwidth, R, may be shaped to maintain a minimum redundancy, Y, such as by dynamically controlling repair bandwidth (e.g., on-the-fly, in real-time, in near real-time, etc.). In operation, repair bandwidth may be increased if redundancy drops to or below the minimum redundancy metric, Y, according to embodiments. Correspondingly, the repair bandwidth may be decreased, such as when the node failure rate decreases, according to embodiments. Additionally or alternatively, large erasure control according to embodiments provides operation to provide improved access properties. For example, requests for data may be made for a number of fragments (e.g., k+Y fragments) more than that needed to decode the data, whereby the data may be decoded as soon as a sufficient number of fragments (e.g., k or k+x, where x<Y) are received, thereby avoiding node and network latency issues according to embodiments. Moreover, access speeds may be increased through a small increase in redundancy (e.g., redundancy >Y), according to embodiments. Additionally or alternatively, a data organization scheme may be employed to support efficient data accesses, such as data access to small portions of stored data, according to embodiments.

In facilitating the foregoing, the exemplary embodiment of FIG. 2A comprises access server 210, having large erasure code storage control logic 250 according to the concepts herein, in communication with EU device 220 to provide storage services with respect thereto. Source data for which storage services are provided by storage systems of embodiments herein may comprise various configurations of data including blocks of data (e.g., source blocks of any size) and/or streams of data (e.g., source streams of any size). The source objects corresponding to such source data as stored by storage systems of embodiments, may comprise individual files, collections of files, data volumes, data aggregations, etc., as well as portions thereof, as may be provided for storage processing (e.g., encoding, writing, reading, decoding, etc.) as blocks of data, streams of data, and combinations thereof. Thus, source objects herein may comprise application layer objects (e.g., with metadata), a plurality of application layer objects, some portion of an application layer object, etc. Such source objects may thus be quite small (e.g., on the order of hundreds or thousands of bytes), quite large (e.g., on the order of megabytes, gigabytes, terabytes, etc.), or any portion of data that may be separated into fragments or portions of fragments as described herein.

Access server 210 may comprise one or more servers operable under control of an instruction set to receive data from devices such as EU device 220, and to control storage of the data and to retrieve data in response to requests from devices such as EU device 220, wherein the HTTP 1.1 protocol using the GET and PUT and POST command and byte range requests is an example of how an EU device can communicate with an access server 210. Accordingly, access server 210 is further in communication with a plurality, M, of storage nodes (shown here as storage nodes 230-1 through 230-M), wherein the HTTP 1.1 protocol using the GET and PUT and POST command and byte range requests is an example of how an access server 210 can communicate with storage nodes 230-1 through 230-M. The number of storage nodes, M, is typically very large, such as on the order of hundreds, thousands, and even tens of thousands in some embodiments. Storage nodes 230-1 through 230-M may comprise a homogeneous or heterogeneous collection or array (e.g., RAID array) of storage media (e.g., hard disk drives, optical disk drives, solid state drives, RAM, flash memory, high end commercial servers, low cost commodity servers, personal computers, tablets, Internet appliances, web servers, SAN servers, NAS servers, IAN storage servers, etc.) providing persistent memory in which the electronic data is stored by and accessible through access server 210. EU device 220 may comprise any configuration of device (e.g., personal computer, tablet device, smart phone, personal digital assistant (PDA), camera, Internet appliance, etc.) which operates to generate, manage, and/or access electronic data. It should be appreciated that although only a single such device is shown, storage system 200 may operate to serve a plurality of devices, some or all of which may comprise devices in addition to or in the alternative to devices characterized as "end user" devices. Any or all of the foregoing various components of storage system 200 may comprise traditional (e.g., physical) and/or virtualized instances of such components, such as may include virtualized servers, virtualized networking, virtualized storage nodes, virtualized storage devices, virtualized devices, etc.

FIG. 2B shows additional detail with respect to access server 210 of embodiments. Access server 210 of the illustrated embodiment comprises a plurality of functional blocks, shown here as including processor 211, memory 212, and input/output (I/O) element 213. Although not shown in the representation in FIG. 2B for simplicity, access server 210 may comprise additional functional blocks, such as a user interface, a radio frequency (RF) module, a display, etc., some or all of which may be utilized by operation in accordance with the concepts herein. The foregoing functional blocks may be operatively connected over one or more buses, such as bus 214. Bus 214 may comprises the logical and physical connections to allow the connected elements, modules, and components to communicate and interoperate.

Processor 211 of embodiments can be any general purpose or special purpose processor capable of executing instructions to control the operation and functionality of access server 210 as described herein. Although shown as a single element, processor 211 may comprise multiple processors, or a distributed processing architecture.

I/O element 213 can include and/or be coupled to various input/output components. For example, I/O element 213 may include and/or be coupled to a display, a speaker, a microphone, a keypad, a pointing device, a touch-sensitive screen, user interface control elements, and any other devices or systems that allow a user to provide input commands and receive outputs from access server 210. Additionally or alternatively, I/O element 213 may include and/or be coupled to a disk controller, a network interface card (NIC), a radio frequency (RF) transceiver, and any other devices or systems that facilitate input and/or output functionality of client device 210. I/O element 213 of the illustrated embodiment provides interfaces (e.g., using one or more of the aforementioned disk controller, NIC, and/or RF transceiver) for connections 201 and 202 providing data communication with respect to EU device 220 and storage nodes 230-1 through 230-M, respectively. It should be appreciated that connections 201 and 202 may comprise various forms of connections suitable for data communication herein, such as provided by wireline links, wireless links, local area network (LAN) links, wide area network (WAN) links, SAN links, Internet links, cellular communication system links, cable transmission system links, fiber optic links, etc., including combinations thereof.

Memory 212 can be any type of volatile or non-volatile memory, and in an embodiment, can include flash memory. Memory 212 can be permanently installed in access server 210, or can be a removable memory element, such as a removable memory card. Although shown as a single element, memory 212 may comprise multiple discrete memories and/or memory types. Memory 212 of embodiments may store or otherwise include various computer readable code segments, such as may form applications, operating systems, files, electronic documents, content, etc.

Access server 210 is operable to provide reliable storage of data within storage system 200 using large erasure code storage control, such as may be configured to provide liquid distributed storage control. Accordingly, memory 212 of the illustrated embodiments comprises computer readable code segments defining large erasure code storage control logic 250, which when executed by a processor (e.g., processor 211) provide logic circuits operable as described herein. In particular, large erasure code storage control logic 250 of access server 210 is shown in FIG. 2B as including a plurality of functional blocks as may be utilized alone or in combination to provide various aspects of storage control (e.g., liquid distributed storage control operation) for reliably storing data within storage system 200. Further detail regarding the implementation and operation of liquid distributed storage control by a storage system is provided in U.S. patent application Ser. Nos. 14/567,203, 14/567,249, and 14/567,303 each entitled "SYSTEMS AND METHODS FOR RELIABLY STORING DATA USING LIQUID DISTRIBUTED STORAGE," and each filed Dec. 11, 2014, the disclosures of which are hereby incorporated herein by reference.

Large erasure code storage control logic 250 of the illustrated embodiment includes large erasure code logic 251, lazy repair policy logic 252, repair bandwidth control logic 253, and data organization logic 255. It should be appreciated that embodiments may include a subset of the functional blocks shown and/or functional blocks in addition to those shown.

The code segments stored by memory 212 may provide applications in addition to the aforementioned large erasure code storage control logic 250. For example, memory 212 may store applications such as a storage server, useful in arbitrating management, storage, and retrieval of electronic data between EU device 210 and storage nodes 230-1 through 230-M according to embodiments herein. Such a storage server can be a web server, a NAS storage server, a SAN storage server, an IAN storage server, and/or the like.

In addition to the aforementioned code segments forming applications, operating systems, files, electronic documents, content, etc., memory 212 may include or otherwise provide various registers, buffers, caches, queues, and storage cells used by functional blocks of access server 210. For example, memory 212 may comprise one or more system maps that is maintained to keep track of which fragments are stored on which nodes for each source object. Additionally or alternatively, memory 212 may comprise various registers storing operational parameters, such a erasure code parameters, utilized according to embodiments. Likewise, memory 212 may comprise one or more repair queues, such as repair queue 254, providing a hierarchy of source object instances for repair processing.

In operation according to embodiments, the source blocks of electronic data are stored in storage system 200 as objects. The source objects utilized herein may, for example, be approximately equal-sized. Source blocks, and thus the corresponding objects stored by the storage system, may comprise individual files, collections of files, data volumes, data aggregations, etc. and may be quite large (e.g., on the order of megabytes, gigabytes, terabytes, etc.). Access server 210 may operate to partition arriving source data into source objects and to maintain mapping of the source data to the source objects (e.g., Map:App-Obj comprising an application or source object map providing mapping of source data to objects). Access server 210 may further operate to erasure encode the source objects, divide the source objects into fragments, store each fragment of a source object at a different storage node, and maintain a source object to fragment map (e.g., Map:Obj-Frag comprising an object fragment map providing mapping of objects to fragments). Accordingly, the objects are partitioned by logic of access server 210 into fragments for storage in the storage system. For example, an object may be partitioned into k fragments for storage in storage system 200. Each of the k fragments may be of equal size according to embodiments. In operation according to embodiments herein the aforementioned fragments may comprise a plurality of symbols.

In implementing such partitioned storage of source data according to embodiments there can be a unique encoded symbol ID (ESI) associated with each of the M storage nodes, and all fragments stored on the storage node are generated using the ESI associated with that node. Thus a mapping may be maintained for each storage node indicating the associated ESI and a mapping may be maintained for each source object indicating which fragments are stored on which storage nodes (e.g., a Map:Obj-Frag map indicating the encoded symbol ID (ESI) and the storage node ID for each fragment of each source object). Alternatively, mapping of ESIs to storage nodes may be maintained individually for each object, or for a group of objects and thus a storage node may have a fragment associated with a first ESI for a first object and a fragment associated with a second ESI for a second object. In some embodiments, multiple ESIs may be mapped to the same storage node for an object.

The particular storage nodes upon which the n fragments for any source object are stored may be selected by assigning the source object to a data storage pattern (also referred to as a placement group), wherein each data storage pattern is a set of n preselected storage nodes (e.g., as may be identified by a storage node identifier). That is, a data storage pattern is a set of n storage nodes on which the fragments of a source object are placed. In a typical storage system where n is much smaller than M, the number of patterns t may be approximately a constant multiple of the number of storage nodes M. The number of data storage patterns can vary over time, such as due to storage node failures rendering data storage patterns incident thereon obsolete. In alternative embodiments, a data storage pattern is a set of n preselected disks, wherein a disk may be a HDD disk or an SSD or any other type of storage device and wherein a storage node may host multiple disks. That is, a data storage pattern is a set of n disks on which fragments of a source object are placed.

Embodiments herein may for different sets of objects operate to assign ESIs in a different order (e.g., permutation of the ESIs) to the same set of storage nodes of a large/liquid storage system. Furthermore, different sets of ESIs may be assigned to the same set of storage nodes for different sets of objects. In implementing such an ESI pattern for a set of objects (i.e., an ESI pattern is a mapping of a set of ESIs to a set of storage nodes for a given set of objects) technique according to embodiments, a set of ESI patterns is specified to the same set of storage nodes (e.g., the available storage nodes), wherein the ESIs assigned to the same storage node is different across the different ESI patterns. As an example, 100 ESI patterns may be specified that map a given set of 3000 ESIs to the same set of 3000 storage nodes (e.g., where k=2000 and n=3000), wherein the mapping of the ESIs to the storage nodes for each ESI pattern may be specified by choosing independently a random permutation of the ESIs and mapping the permutation to the storage nodes in a fixed order. As source objects are stored in the storage system, they may be assigned to one of the 100 ESI patterns (e.g., in round-robin fashion), whereby the ESI pattern assignments determine which fragments (identified by their ESI) are stored at which storage node for the source object. It should be appreciated that implementation of such ESI pattern embodiments greatly ameliorates the concern that the underlying erasure code, such as RAPTORQ, is not a MDS code, and greatly reduces the risk of having to perform emergency repair at a very high overall peak repair rate. In alternative embodiments, an ESI pattern is a mapping of a set of ESIs to a set of disks.

Irrespective of the particular ESI assignment scheme utilized, the aforementioned mapping information may be updated for source objects indicating which fragments are available when a storage node permanently fails. Access server 210 may operate to determine which source object particular source data (e.g., source data requested by EU device 220) is contained within (e.g., using a Map:App-Obj map) and to read the data from the storage nodes storing the appropriate fragments by determining which of the fragments contain relevant source or repair data (e.g., using a Map:Obj-Frag map).

In providing resilient and reliable storage of the data, access server 210 of embodiments utilizes one or more erasure codes with respect to the source objects, wherein repair fragments are generated to provide redundant data useful in recovering data of the source object. For example, embodiments of large erasure code storage control logic implement erasure codes parameterized as (n; k; r), where k is the number of source symbols in a source block, n is the total number of encoded symbols, and r=n−k is the number of repair symbols.

An (n; k; r) erasure code solution, wherein (n; k; r) are small constants, is said to be a small erasure code solution if n<<M or if n is small independently of M (e.g. n<30, or n<20). In utilizing such a small erasure code, a source object is typically partitioned into k source fragments that are erasure encoded to generate n encoded fragments, wherein r of the n fragments are repair fragments. Of the M storage nodes in the storage system, n storage nodes may then be chosen (e.g., storage nodes chosen randomly, storage nodes having independent failures chosen, etc.) and the n fragments stored to the n chose storage nodes, one fragment per storage node. Maximum Distance Separable (MDS) erasure codes are an example of such small erasure. The repair strategy traditionally implemented with respect to such small erasure codes is a reactive, rapid repair policy.

An (n; k; r) erasure code solution is a large erasure code solution if n=M (i.e., for each source object there are fragments stored at all the storage nodes), if n is a significant fraction of M (e.g., n≥½·M), or if n is large although perhaps chosen independently of M (e.g., n≥50, or n≥30). An exemplary large erasure code such as may be utilized according to embodiments herein include RAPTORQ as specified in IETF RFC 6330, available from Qualcomm Incorporated. Further examples of large erasure codes as may be utilized herein include RAPTOR as specified in IETF RFC 5053, LDPC codes specified in IETF RFC 5170, tornado codes, and Luby transform (LT) codes.

A property of maximum distance separable (MDS) erasure codes is that all k source symbols can be recovered from any k of the n encoded symbols. Particular erasure codes that are not inherently MDS, such as the exemplary large erasure codes herein (e.g., RAPTORQ), provide a high (e.g., 99%) probability that the k source symbols can be recovered from any k of the n encoded symbols and a higher (e.g., 99.99%, 99.9999%, etc.) probability that the k source symbols can be recovered from any k+x (e.g., x=1, 2, etc.) of the n encoded symbols.

In operation, each fragment (i.e., the source fragments and repair fragments) of a source object is stored at a different storage node than the other fragments of the source object (although multiple fragments are stored at the same storage node in some embodiments). The storage overhead is the ratio of the total target amount of repair data for all objects divided by the total target amount of source and repair data for all objects in the storage system when using a systematic erasure code for storage. Thus, the storage overhead is the target fraction of the used storage that is not for source data.

In some cases, source data is not directly stored in the storage system, only repair data. In this case, there are n repair fragments stored in the storage system for each object, where generally any k (for some erasure codes slightly more than k is sometimes utilized) of the n fragments can be used to recover the original object, and thus there is still a redundant storage of r=n−k repair fragments in the storage system beyond the k needed to recover the object. An alternative type of storage overhead is the ratio of the total target amount of redundant data (r=n−k) divided by the total amount of source data (k), i.e., the storage overhead is r/k for this type. Generally herein r/n is used as the storage overhead, and one skilled in the art can see that there is a conversion from one type of storage overhead to the other type of storage overhead.

In operation according to a reactive, rapid repair policy, the repair of missing fragments is implemented at a high bandwidth when a storage node fails. That is, the repair policy causes repair server functionality of an access server to attempt to repair fragments lost on a storage node as soon as possible in order to repair a failed storage node before another storage node fails and in order to avoid source objects having more than one missing fragment (as is generally necessary in order to meet reliability targets in light of the small number of repair fragments, or redundant data, available using a small erasure code). Such reactive, rapid repair policies use a large amount of burst repair traffic at times that are dictated by when nodes fail and not at scheduled times. Thus, the burst repair traffic might occur at times when other processes that share the bandwidth are active, such as access processes retrieving data from the storage system or storage processes storing data to the storage system. Thus, if one of these other processes happens to be actively using bandwidth in a period of time that overlaps with the burst repair traffic triggered by a storage node failure, the performance of these other processes can be negatively impacted (e.g., degraded, by the burst repair traffic).

Although small erasure codes, such as those described above (e.g., n M), may be utilized in some embodiments, the illustrated embodiment of access server 210 implements (e.g., using large erasure code logic 251) a large erasure code (e.g., n≥½·M) solution to provide storing and accessing source data in a reliable and efficient manner within a storage system of unreliable nodes. In utilizing such a large erasure code according to embodiments, a source object may be partitioned into k source fragments that are erasure encoded to generate n encoded fragments, wherein in some embodiments r of the n fragments are repair fragments. The n fragments may then be stored to the M storage nodes, one fragment per storage node.

Large erasure code storage control logic 250 of embodiments implements a repair policy in order to provide recovery of lost fragments and thereby facilitate resilient and reliable storage of the source data. For example, a repair policy of large erasure code storage control logic 250 may run in the background (e.g., as a background task to a storage server application) to monitor storage nodes to determine which storage nodes have failed and provide operation to replace fragments stored on the failed storage node. In operation according to embodiments, an object to fragment mapping (e.g., the aforementioned Map:Obj-Frag map) may be utilized to keep track of where fragments are located such that when a storage node is determined to have permanently failed the loss of the fragments stored thereby are identified (e.g., the fragments which are no longer available due to failure of the storage node are determined). These fragments, or some portion thereof, may be tracked in a repair queue for repair operations in accordance with the repair policy.

Although it may be beneficial to use a reactive, rapid repair policy (i.e., when a fragment of an object is lost due to a permanent node failure, the repair policy replaces the lost fragment with another fragment as quickly as possible) for a small erasure code solution, embodiments utilize a lazy repair policy (i.e., objects are allowed to accumulate whereby they may be repaired at a steady repair rate, R), such as through operation of lazy repair policy logic 252. It should be appreciated, however, that embodiments may implement a repair policy other than a lazy repair policy, such as a reactive repair policy.

In implementing a lazy repair policy according to embodiments, the repair rate, R, is designed to ensure a large mean time to loss of any source data (MTTDL). The repair rate may be expressed as the number of bits of source objects repaired per second (i.e., the rate in bits per second that source objects are processed from a state of missing fragments to a state of having all fragments available). This form of expressing the repair rate is convenient since generally it also corresponds to the rate at which data is read from storage nodes by the repair process. However, there are many other forms of expressing the repair rate. For example, the repair rate may be expressed as the amount of time it takes to repair each source object (e.g., in the case when all source objects are the same size), or the amount of time per byte of source object repair. As one skilled in the art will recognize, any of these forms of expressing the repair rate can be easily converted to another form. Additionally or alternatively, repair bandwidth usage may be scheduled to occur at times that are largely independent of the specific timing of node failures. For example, repair bandwidth may be scheduled to be used for a couple of hours each night when other bandwidth activity, such as access or storage of data, is quiescent. Thus, the repair process may use most or all of the available bandwidth for a short period of time on a regular basis, to avoid interrupting or disrupting other bandwidth intensive activities such as access or storage of data. As another example, the repair process may be scheduled to occur only occasionally when the storage system is powered up, and at other times the storage system is powered down to save on energy consumption and costs. The scheduling of the repair process to use repair bandwidth may also be on an irregular basis (i.e., scheduled when other processes such as reading or writing data to storage are relatively inactive). In every case, the repair bandwidth usage can be crafted to avoid interrupting other processes that send or receive data over some or parts of the same networking paths as used by the repair process, and the repair bandwidth usage can be so crafted independently of the timing of data loss events such as storage node failures. The amount of repair done during these periods may be determined by a repair policy that dictates the desired average rate of repair over longer time periods. Thus, on a longer time scale the repair process is fluid and may be modulated to respond to changing conditions such as node failure rates while on a short time scale the repair may be scheduled for system convenience such as described in the preceding examples.

In operation, logic of the repair policy may, based on the aforementioned system maps, determine which fragments are available and which are missing for each source object. Repair processing is performed according to embodiments with respect to those fragments that are determined to be permanently lost, such as due to permanent failure of the storage node upon which the fragment is stored. Permanent failure of the storage nodes is often modeled by a Poisson process parameterized by $\lambda$, which denotes the failure rate of each node according to an exponential distribution. A time varying rate parameter may be a more suitable model to capture changes in conditions, quality of components, etc.

The repair policy of embodiments maintains a repair queue of object instances (e.g., repair queue 254), wherein a source object instance is added to the repair queue for a source object when it is possible to generate and store additional fragments for that source object (e.g., when storage nodes that store fragments for that source object have failed, when new or replacement storage nodes have been added to the storage system, etc.).

Embodiments implementing a large erasure code solution using a lazy repair policy may operate to add a source object instance to the repair queue when a pre-specified minimum number (e.g., minQ>1, minQ=1, etc.) of fragments for that source object are lost due to node storage failures, such as to limit the overall amount of repair traffic. Equivalently, all objects may be in the queue but repair is suspended when no object has more than minQ erased fragments.

Whenever there is at least one source object instance in the repair queue that has a sufficient number of missing fragments the repair policy of embodiments works to repair the source objects corresponding to source object instances in the repair queue. For example, logic implementing the repair policy may linearly cycle through the object instances in the repair queue, read in at least k fragments to recover a source object in need of repair, and generate and store additional fragments for the source object on one or more replacement storage nodes.

Utilization of traditional data organization schemes (i.e., dividing the source object into blocks of contiguous data) can often result in inefficiencies in accessing the data within a storage system. For example, the various media of the storage nodes have limitations regarding their random input/output (I/O) performance. Hard disks (HDs) typically provide random I/O performance of approximately 100-200 I/Os per second, providing an efficient random read size on the order of 512 KB (e.g., NBsize=512 KB, where NBsize is the size of a node block which is the efficient read unit of data from the storage nodes). Solid state drives (SSDs), on the other hand, typically provide random I/O performance of approximately 100,000+I/Os per second, providing an efficient random read size on the order of 4 KB (e.g., NBsize=4 KB).

In operation, where a portion of data smaller than the NBsize for a particular storage node storing the data is accessed, the storage node will generally return an amount of data equal to its NBsize, whereby the portion of data actually requested may be extracted (e.g., by the access node controlling the data access). Although SSDs provide relatively high I/O performance, and thus relatively small NBsize, the use of SSDs in a storage system nevertheless presents efficiency challenges with respect to accessing portions of data smaller than 4 KB. Moreover, SSDs are generally more expensive to obtain and deploy, as compared to HDs, and thus often do not make up a majority of the storage node media in use today.

It should be appreciated that, where the storage system implements an erasure code (e.g., an (n; k; r) erasure code), when data is being accessed from the storage system a plurality of fragments (e.g., k) will be read and transferred over the network from a plurality of the storage nodes. Thus, an efficient access block size (ABsize) is the minimal number of fragments needed to reconstruct a portion (or blob) of source data times the node block size (e.g., ABsize=k·NBsize). For example, in a HD storage node implementation of a storage system using a large erasure code, k may be 1024 and thus ABsize=1024·512 KB=512 MB. In a SSD storage node implementation of a storage system using the same large erasure code, ABsize=1024·4 KB=4 MB.

From the foregoing, it can be appreciated that the access efficiency experienced in operation of a storage system is a function of the data requests and the foregoing efficient access block size. The access efficiency includes both I/O efficiency and traffic efficiency components.

I/O efficiency is a measure of the amount of data that needs to be read from the storage nodes of the system to retrieve a given portion of source data. Thus, I/O efficiency may be represented as the amount of data, D, returned from the storage nodes per access block divided by the ABsize (D/ABsize=D/(k·NBsize), where the number of disk I/Os is k to generate D. For example, where an application requests 1 MB of a 512 MB access block, the I/O efficiency is 1/512≈0.002. A typical pattern of data access using a typical object organization within a storage system may not be I/O efficient, resulting in applications using only a small portion of data in an access block.

Traffic efficiency is a measure of the amount of data transmitted over the network for a given portion of requested source data. Accordingly, the traffic efficiency may follow the I/O efficiency. However, in storage system implementations where the access server or other cloud based logic does not return all the data read to the requesting application, the traffic efficiency may be different from the I/O efficiency. For example, in operation of embodiments of the above mentioned storage systems implementing liquid distributed storage control, traffic efficiency may be 1 (i.e., only the requested portion of data is transmitted to the requesting application) even when the I/O efficiency is less than 1.

Moreover, there can be a high traffic cost of accessing source data that is not currently available (e.g., due to an intermittent storage node failure or due to a permanent storage node failure that has not yet been repaired). For example, the access properties of a typical storage system, such as that provided by an AZURE cloud platform available from Microsoft Corporation, provide for reading f(D) bytes from the storage nodes to access D bytes of source data, wherein the value of f(D) depends on the state of the storage system. If the source data is within source fragments on available storage nodes, the system may directly read the source data from the storage nodes, and thus f(D)=D and the access is traffic efficient (although the traffic may be from one storage node which, if that storage node is operating slowly for any reason, may dramatically degrade the read performance). However, if the source data is within one or more source fragments on failed storage nodes, direct reading of the data fails and the reads are slowed down or even stalled (e.g., waiting on the read to resolve). The source data may be recovered from k other fragments on available storage nodes, whereby f(D)=k·D and thus the access is traffic inefficient by a factor of k. It should be appreciated that the forgoing traffic inefficiency, wherein k times the amount of data being accessed is read and transferred over the network for recovering data in the case of a failed storage node is particularly problematic with respect to the use of a large erasure code, wherein k is quite large.

Figure 3A:
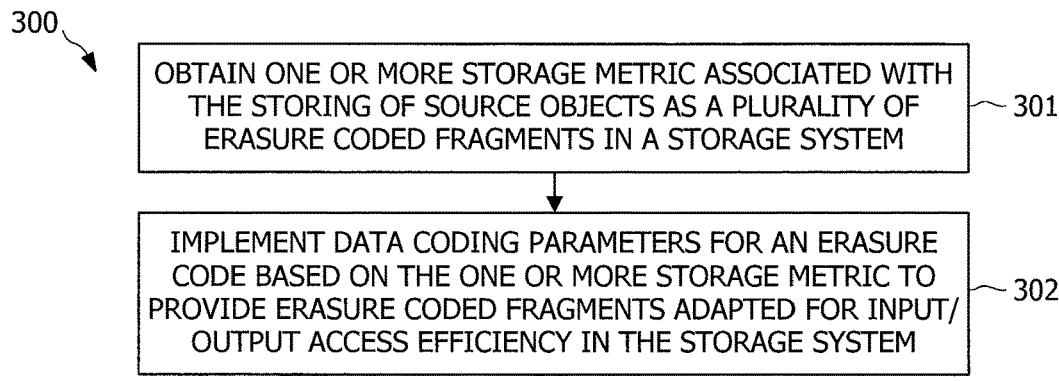
FIG. 3A shows a high level flow diagram of implementation of data organization techniques according to embodiments herein.

Accordingly, as shown in FIG. 2B, embodiments of large erasure code storage control logic 250 implement one or more data organization techniques, such as may be implemented by data organization logic 255, that facilitate traffic efficient and/or I/O efficient access to the source data. The high level flow diagram of FIG. 3A shows operation according to exemplary flow 300 for implementing data organization techniques of embodiments herein, such as the blob based data organization techniques, grouped symbols organization techniques, blob based grouped symbols organization techniques, and data ordering organization techniques described in further detail below. Data organization techniques of embodiments provide for access efficiency by implementing data coding parameters based upon one or more storage metrics to provide storage of source data as fragments in storage nodes of a storage system adapted for I/O access efficiency. Accordingly, at block 301 of the illustrated embodiment one or more storage metrics associated with storing source objects as a plurality of erasure coded fragments in the storage system are obtained.

The one or more storage metrics obtained according to embodiments may comprise storage device metrics and/or source data metrics. Storage device metrics as may be obtained and utilized according to embodiments herein may include storage node read unit size for one or more storage node configurations (e.g., the size of a node block NBsize which is the efficient read unit of data for each type of storage node), target storage overhead, etc. Source data metrics as may be obtained and utilized according to embodiments herein may include sizes of a group of application data chunks that are typically accessed together (e.g., blob sizes, blob size ranges, etc.), a type of data of the source data, data access priority for the source data, etc.

The one or more storage metrics are used at block 302 of the illustrated embodiment to implement data coding parameters for one or more erasure codes to provide erasure coded fragments adapted for I/O access efficiency in the storage system. For example, the plurality of storage metrics may comprise storage metrics (e.g., a storage node read unit size and/or a size of a group of application data chunks that are typically accessed together) for which data coding parameters are selected to provide erasure coded fragments in one or more efficient access block sizes. A plurality of efficient access block sizes may be provided with respect to a storage system adapted according to embodiments, such as to facilitate access to different application data chunk sizes (e.g., blob sizes), storage using different storage node configurations, etc. The data coding parameters implemented with respect to particular storage metrics may comprise a number of storage nodes from which the source object can be recovered, the type of configuration of storage nodes on which to store data for the source object, the total number of storage nodes storing data for the source object, an erasure code symbol overhead, a number of fragments stored per storage node for a source object, etc. Such data coding parameters may be selected with respect to any particular storage metric, or combination thereof, to provide erasure coded fragments adapted for rapid and/or high reliability decoding. Embodiments of the foregoing data organization techniques are thus adapted to optimize (e.g., maximize) I/O efficiency and/or (e.g., minimize) storage overhead, while maintaining MTTDL, repair efficiency, and/or traffic efficiency.

A data organization technique implemented according to embodiments provides a blob based organization implementation of large erasure code storage control 250. A "blob" as referred to in a blob based organization technique is a group of application data chunks that are physically accessed together. For example, a blob may comprise the data of a particular data object (or other chunk of application data), such as a digital photograph, a digital document, a digital video file, etc. Likewise, a blob may comprise a plurality of data objects (or other separate chunks of application data), such as one or more digital documents and one or more related digital photographs. For example, a blob may comprise a group of application data chunks that are typically accessed together. Accordingly, irrespective of the particular content of a blob, if data is accessed together then that collection of data is a candidate for designation as a blob according to embodiments herein.

In operation of a typical storage system, source objects are formed from a concatenation of whatever application data arrives to be stored at the storage system. When the source object grows to a certain size, that source object is sealed, redundantly encoded, and stored to the storage nodes of the storage system. In contrast to this typical storage system operation, storage system 200 implementing a blob based organization technique of embodiments utilizes a plurality of source objects concurrently, whereby blobs of data arriving at the storage system for storage are assigned to a particular source object of the plurality of source objects based upon the size of the respective blob. For example, possible blob sizes may be partitioned into ranges, whereby one source object of the plurality of source objects is assigned to each such range. Thus, when a blob of data arrives at the storage system, the blob may be assigned to the source object with the assigned range containing the blob size and the blob concatenated to that source object. Each such source object may be sealed when it reaches a certain size and a new source object with the same range started to accept subsequent blobs in the assigned range.

In operation of data organization techniques of embodiments, the source objects may be thought of as a stream, as opposed to an object of a particular size, whereby the data of the stream is splayed into fragments (e.g., as if a rope into strands). The weaver data organization, which provides traffic efficient access, is an example of a data organization that can support source objects viewed as a stream, as disclosed in U.S. patent application Ser. No. 14/567,303 entitled "SYSTEMS AND METHODS FOR RELIABLY STORING DATA USING LIQUID DISTRIBUTED STORAGE," filed Dec. 11, 2014, the disclosure of which is incorporated herein by reference, and as described in more detail later in this specification. For example, a source object may be splayed into a plurality of strands, wherein data for each of those strands is written to a different node as a fragment. In operation according to embodiments, an object can be erasure coded as it is arriving. This streaming type concatenation of the source object allows the repair policy to avoid handling large objects, instead streaming data into the storage nodes at a very fine granularity (e.g., Bsize is a small fraction of NBsize). Accordingly, instead of having different source objects that are active, embodiments may utilize a plurality of streams, whereby each stream is assigned to a certain range or blob sizes that are to be appended into that stream. For example, blobs arriving at the storage system may be appended into a particular stream if the respective blob fits into the range assigned to the stream, whereby the resulting fragments are formed and streamed to the storage nodes.

Irrespective of whether a particular implementation utilizes a plurality of source objects or a plurality of streams, embodiments of blob based organization techniques may employ different data coding parameters (e.g., number of source fragments, number of repair fragments, number of storage nodes from which a source object/stream can be recovered, number of storage nodes storing data for a source object/stream, number of symbols per fragment, etc.) for the different blob sizes and/or blob size ranges. Additionally or alternatively, embodiments of blob based organization techniques may employ different data coding parameters for source objects/streams to be stored in different configurations of storage nodes (e.g., HD storage nodes, SSD storage nodes, etc.). The particular data coding parameters utilized may be selected to collectively provide blob based organization operation that provides for efficient I/O with minimal storage overhead.

Figure 3B:
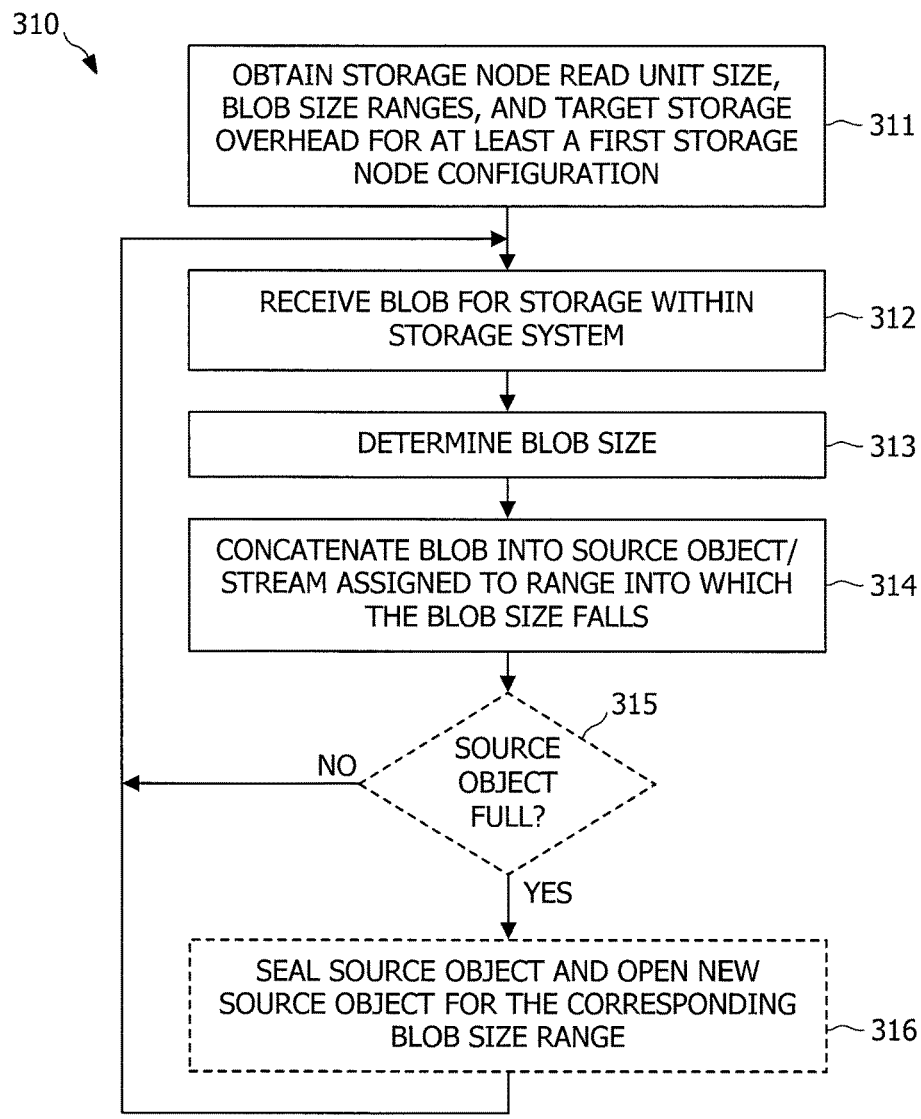
FIG. 3B shows a high level flow diagram of operation of data organization techniques according to embodiments herein.

FIG. 3B shows a high level flow diagram of operation of a blob based organization technique according to embodiments herein. Functions of flow 310 of the illustrated embodiment may be implemented by data organization logic 255, for example.

At block 311 of the illustrated embodiment, storage metrics associated with storage of source objects as a plurality of erasure coded fragments in the storage system according to a blob based organization technique of embodiments are obtained. In particular, the illustrated embodiment provides for obtaining storage metrics comprising storage node read unit size, blob size ranges, and target storage overhead. It should be appreciated that operation at block 311 according to embodiments corresponds to the operation of block 301 of flow 300 described above.

In operation according to embodiments, the data coding parameters implemented with respect to the erasure code for source data received by the storage system for storage correspond one or more of the storage metrics obtained at block 311. The data coding parameters implemented by a blob based organization technique of embodiments may, for example, comprise a number of storage nodes source data can be recovered from, a total number of storage nodes storing data for a source object, etc., for each blob size range. The blob size ranges and associated data coding parameters may be selected as a function of storage device metrics such as the read unit size (NBsize) of the configuration(s) of storage nodes (e.g., HD, SSD, etc.) upon which the data is to be stored. A storage administrator, system administrator, user, etc. may provide various ones of the data coding parameters and/or information from which one or more of the data coding parameters may be determined. The blob size ranges and associated data coding parameters may, for example, be selected as a function of the sizes of data chunks expected to be prevalent in the storage system, to provide various predetermined efficient access block sizes (ABsize) to accommodate typical or prevalent data accesses in the storage system, to provide suitable data resiliency with approximately a target storage system storage overhead, etc. Additionally or alternatively, source data metrics such as the blob size ranges and/or associated data coding parameters may be determined dynamically, such as in operation of the storage system as source data is arriving for storage within the storage system, as a function of the sizes of data chunks being provided to and/or accessed from the storage system, to provide various efficient access block sizes (ABsize) to accommodate the data accesses, to provide suitable data resiliency with approximately a target storage system storage overhead, etc.

Table 1 below shows blob size ranges and associated data coding parameters in an exemplary blob based organization implementation for storage nodes having a NBsize of 512 KB (e.g., HD storage nodes). In the example of Table 1, the target storage overhead ($\beta$) is 0.333, whereby the parameters provide an asymptotic storage overhead approaching this target. The sk parameter represents the number of storage nodes from which the source object can be recovered and the sn parameter represents the total number of storage nodes storing data for the source object (sr=sn−sk). An erasure code utilized by a blob based organization implementation may be parameterized for each blob as (n; k; r)=(sn; sk; sr).

TABLE 1

NBsize = 512 KB

| Blob Size Ranges and Associated Data Coding Parameters | | | Access Block Size and Storage Overhead | |
|---|---|---|---|---|
| Blob Size Range | sk | sn | ABsize | $\beta$ |
| <4 MB | 8 | 20 | 4 MB | 0.6 |
| 4-8 MB | 16 | 32 | 8 MB | 0.5 |
| 8-16 MB | 32 | 56 | 16 MB | 0.43 |
| 16-32 MB | 64 | 104 | 32 MB | 0.38 |
| 32-64 MB | 128 | 200 | 64 MB | 0.36 |
| 64-128 MB | 256 | 392 | 128 MB | 0.35 |
| 256-512 MB | 512 | 776 | 256 MB | 0.34 |
| >256 MB | 1024 | 1544 | 512 MB | 0.337 |

As previously mentioned, source data metrics such as the blob size ranges and associated data coding parameters may be selected as a function of the read unit size (NBsize) of the configuration of storage nodes upon which the data is to be stored. Table 2 below shows blob size ranges and associated data coding parameters in an exemplary blob based organization implementation for storage nodes having a different NBsize than that of the exemplary configuration of Table 1. In particular, Table 2 shows exemplary blob size ranges and associated data coding parameters for storage nodes having NBsize of 4 KB (e.g., SSD storage nodes). In the example of Table 2, the target storage overhead ($\beta$) is again 0.333.

TABLE 2

NBsize = 4 KB

| Blob Size Ranges and Associated Data Coding Parameters | | | Access Block Size and Storage Overhead | |
|---|---|---|---|---|
| Blob Size Range | sk | sn | ABsize | $\beta$ |
| <32 KB | 8 | 20 | 32 KB | 0.6 |
| 32-64 KB | 16 | 32 | 64 KB | 0.5 |
| 64-128 KB | 32 | 56 | 128 KB | 0.43 |
| 128-256 KB | 64 | 104 | 256 KB | 0.38 |
| 256-512 KB | 128 | 200 | 512 KB | 0.36 |
| 512 KB-1 MB | 256 | 392 | 1 MB | 0.35 |
| 1-2 MB | 512 | 776 | 2 MB | 0.34 |
| >2 MB | 1024 | 1544 | 4 MB | 0.337 |

Having obtained the storage metrics (e.g., storage node read unit size, blob size ranges, and target storage overhead), and thus thereby having determined or otherwise obtained associated data coding parameters, operation of flow 310 of the illustrated embodiment proceeds to the implementation of the data coding parameters for the erasure code at blocks 312-316 to store various source data by storage system 200. Accordingly, it should be appreciated that operation at blocks 312-316 according to embodiments corresponds to the operation of block 302 of flow 300 described above.

At block 312 of the illustrated embodiment a blob of data is received by the storage system for storage therein. For example, an application executing with respect to EU device 120 may operate to store data using access server 210 of embodiments.

At block 313 of the illustrated embodiment, the size of the received blob is determined for assigning the blob to an appropriate source object/stream. For example, logic of data organization logic 255 may analyze received data to identify blobs, determine the size of the blobs, and assign the blobs to corresponding source objects/streams based upon the blob size ranges. Thereafter, a blob assigned to a particular source object/stream may be concatenated into the respective source object/stream at block 314. For example, logic of data organization logic 255 may utilize the data coding parameters associated with the respective blob size range to implement erasure encoding and storage of the blob.

As an example of use of the blob size ranges and associated data coding parameters of the exemplary configuration of Table 1 above, if a blob of less than 4 MB is received by the storage system that blob is assigned to a source object/stream configured as sk=8 and sn=20 (e.g., implementing an (n; k; r) erasure code such that n=sn and k=sk), if a blob of 4-8 MB is received that blob is assigned to a source object/stream configured as sk=16 and sn=32, and so on. In the first example above (i.e., blob size is less than 4 MB), the storage system will access 8 storage nodes to recover the source object and will store fragments for the object across 20 storage nodes. In this case, the ABsize=8·512 KB (i.e., sk·NBsize) and thus the access block size is 4 MB. In the second example above (i.e., blob size is 4-8 MB), the storage system will access 16 storage nodes to recover the source object and will store fragments for the object across 32 storage nodes. In this case, the ABsize=16·512 KB and thus the access block size is 8 MB.

As an example of use of the blob size ranges and associated data coding parameters of the exemplary configuration of Table 2 above, if a blob of less than 32 KB is received by the storage system that blob is assigned to a source object/stream configured as sk=8 and sn=20, if a blob of 32-64 KB is received that blob is assigned to a source object/stream configured as sk=16 and sn=32, and so on. In the first example above (i.e., blob size is less than 32 KB), the storage system will access 8 storage nodes to recover the source object and will store fragments for the object across 20 storage nodes. In this case, the ABsize=8·4 KB (i.e., sk·NBsize) and thus the access block size is 32 KB. In the second example above (i.e., blob size is 32-64 KB), the storage system will access 16 storage nodes to recover the source object and will store fragments for the object across 32 storage nodes. In this case, the ABsize=16·4 KB and thus the access block size is 64 KB.

As can be appreciated from the foregoing examples, the efficient access block size corresponds to the blob size to thereby facilitate I/O efficiency. Accordingly, the blob based organization techniques of the example configurations of Tables 1 and 2 provide I/O efficient access for blobs of at least ½ the ABsize (e.g., I/O efficiency ≥0.5 if the blob portions of the fragments are aligned within the node blocks, and I/O efficiency ≥0.25 if the blob portions of the fragments are split across two node blocks). For example, where the blob sizes are uniform within a range, the average I/O efficiency is 0.75 if the blob portions of the fragments are aligned within the node blocks, and the average I/O efficiency is approximately 0.46 if the blob portions of the fragments are uniformly mapped across boundaries of node blocks. Although the above exemplary configuration of Table 1 may be I/O inefficient for accessing blobs of less than 2 MB, this inefficiency with respect to smaller blob sizes may be ameliorated by various techniques, such as caching (e.g., the blobs are of sufficiently small size that caching of the data is reasonably and readily accommodated by memory of storage system 200).

The storage overhead in the example configurations of Tables 1 and 2 is appreciably larger for the smaller sized blobs than for the larger sized blobs. Because the storage system is storing the fragments on much fewer storage nodes for these smaller blob sizes, the foregoing configurations provide more overhead (redundancy) with respect to the smaller blob sizes to provide similar data reliability across all blob size ranges. It should be appreciated, however, that the aggregated amount of data in the lower blob size ranges will likely be significantly less than the aggregated amount of data in the higher blob size ranges, thus resulting in the storage system overhead actually experienced being toward the upper end of the exemplary asymptotic storage overhead. Accordingly, the overall storage overhead approaches the asymptotic storage overhead if larger blobs are the dominant portion of the data.

The foregoing I/O efficiency and reasonable storage overhead is provided by the exemplary configurations of Tables 1 and 2 while maintaining MTTDL, repair efficiency, and traffic efficiency. For example, the aforementioned more storage overhead, perhaps coupled with a more aggressive repair policy, for source objects or streams comprising smaller blobs allows MTTDL to be similar for all blob sizes. Even where a more aggressive repair policy is implemented with respect to the fragments of the smaller sized blobs, the storage system repair bandwidth will nevertheless be dominated by repair of larger blobs due to there being a smaller fraction of data in the storage system for the smaller blobs. Thus, repair efficiency is maintained by the exemplary configurations. Moreover, the traffic efficiency remains unchanged by embodiments of a blob based organization, such as the exemplary configurations of Tables 1 and 2.

Continuing with the example of flow 310 illustrated in FIG. 3B, having concatenated the blob into the appropriate source object/stream based upon the blob size and corresponding blob size range, processing may loop back to block 312 for receiving a subsequent block. For example, where an embodiment implementing streams as described above is utilized, the data may continually be streamed to the storage nodes. Embodiments implementing a plurality of source objects for the blob size ranges may, however, operate to open and seal source objects as a certain amount of data has been concatenated. Accordingly, the embodiment of flow 310 illustrated in FIG. 3B includes optional blocks 315 and 316, as may be implemented in the aforementioned loop to receive subsequent blobs.

Operation of blocks 315 and 316 of the illustrated embodiment facilitates the sealing of a source object as it becomes filled and the opening of another source object for the particular blob size range for storing subsequent blobs of the respective size. Accordingly, a determination is made at block 315 as to whether the respective source object is full. If not, processing according to the illustrated embodiment loops to block 312 to receive subsequent blobs. However, if the source object is full, processing proceeds to block 316 wherein the source object is sealed and written to the storage nodes (as described above) and a new source object is opened. Thereafter, processing according to the illustrated embodiment proceeds to block 312 to receive subsequent blobs, as previously described.

It should be appreciated that various alternatives and options may be implemented with respect to blob based organization techniques, such as those of the example configurations above. For example, embodiments may implement more than one configuration of blob size ranges and associated data coding parameters.

A hybrid storage system in which a plurality of storage node configurations may, for example, provide an implementation in which a plurality of blob size ranges and associated data coding parameter configurations are implemented. In illustrating such an implementation, it is helpful to note that the blob sizes for which blob access results in I/O inefficiency in the exemplary configuration of Table 2 (blob sizes of less than 16 KB) is significantly lower than that of Table 1 (blob sizes of less than 2 MB). For example, a tiered blob based organization embodiment may take advantage of this fact and operate to store blobs having a size of less than 2 MB in storage nodes of a first configuration (e.g., SSD storage nodes), using corresponding blob size ranges and associated data coding parameters (e.g., the configuration of Table 2), and to store blobs having a size of 2 MB or more in storage nodes of a second configuration (e.g., HD storage nodes), using corresponding blob size ranges and associated data coding parameters (e.g., the configuration of Table 1). Such an implementation may provide, for example, I/O efficient access for source objects that range from 16 KB to the largest objects likely to be encountered by the storage system (e.g., providing at least 50% I/O efficiency for each such object if the blob portions of the fragments are aligned within the node blocks, and at least 25% I/O efficiency if the blob portions of the fragments are split across two node blocks).

Another example of a tiered blob based organization embodiment utilizes a selected tier size delineator (X) to determine the storage node configuration and thus blob size ranges and associated data coding parameters used with respect to the blobs, wherein X is larger than the smallest ABsize of the storage node configuration having the largest NBsize (e.g., X=2 MB in the example of the configurations of Tables 1 and 2 providing a tiered blob based organization). For example, embodiments may operate to store blobs having a size of less than some selected size, X, in storage nodes of the first configuration, using a first configuration of blob size ranges and associated data coding parameters, and to store blobs having a size of X or more in storage nodes of the second configuration, using a second configuration of blob size ranges and associated data coding parameters. The tier size delineator (X) may be selected based upon a number of criteria. For example, the larger the size X, the better storage overhead, repair efficiency, and access speed. However, the larger the size X, the more storage nodes of the storage node configuration having the smallest NBsize (e.g., SSD storage nodes in the example of the configurations of Tables 1 and 2 providing a tiered blob based organization).

The alternatives and options that may be implemented with respect to blob based organization techniques are not limited to the exemplary embodiments of tiered blob based organization techniques described above. A further example, as may be implemented with respect to a hybrid storage system, operates to identify larger blobs of higher access priority, blobs of a particular type of source data, etc. and assigns those blobs to storage objects/streams associated with a storage node configuration (e.g., SSD storage nodes) facilitating optimal access (e.g., rapid access, most efficient access, etc.). Additionally or alternatively, embodiments may operate to identify smaller blobs of lower access priority, blobs of another type of source data, etc. and assigns those blobs to storage objects/streams associated with a storage node configuration (e.g., HD storage nodes) facilitating efficient storage (e.g., low cost storage media, largest available storage capacity, etc.), albeit perhaps providing less than optimal access. It should be appreciated that these optional implementations may be combined with other data organization techniques, such as those described in the exemplary embodiments above.

Embodiments of blob based organization logic are adapted to facilitate the use of a single erasure code for a plurality of source objects or streams associated with different ones of the blob size ranges. Accordingly, data organization logic 255 of embodiments may operate to cause multiple fragments (c) per storage node to be stored for a source object. Although the number of fragments c stored per storage node by such blob based grouped symbols organization techniques may be any integer, embodiments can utilize a number of fragments stored per storage node which is a power of 2 (i.e., c=2, 4, 8, etc.), to facilitate compatibility with other parameters of the erasure code, as will be better understood from the exemplary embodiments below.

In operation of a blob based data organization of embodiments, a single erasure code with the same number of source symbols k can be used to support all source objects or streams associated with different blob size ranges. For example, at block 301 of flow 300 illustrated in FIG. 3A, the plurality of storage metrics obtained may include a number of fragments (c) per storage node to be stored for a source object for each blob size range. In implementing such an embodiment of a blob based organization technique (e.g., at block 302 of FIG. 3A), the erasure code parameters (n; k; r) for an erasure code used in the grouped symbols implementation may be set as (n; k; r)=(c·sn, c·sk, c·(sn−sk)), where skis the number of nodes from which a source object can be recovered and sn is the total number of nodes storing data for a source object. Accordingly, a different value of c for each source object or stream associated with a different blob size range may be used by the blob based data organization logic, wherein the value of c is determined based on the supported value of k and the blob size range. More detailed descriptions of embodiments where values of c are appropriately chosen are described in more detail below. As will be appreciated from the examples below, blob based data organization techniques, including embodiments adapted to use a single erasure code to support source objects for different blob size ranges, may be utilized in alone or in combination with other data organization techniques according to the concepts herein.

As previously discussed, large erasure codes that are not inherently MDS (e.g., RAPTORQ) may not guarantee recovery of the source data by decoding k fragments. Accordingly, some additional number of fragments, o, may be utilized to increase recovery reliability (e.g., source object data recovery using k+o fragments, where o=1 provides data recovery in the range of 99.99% and where o=2 provides data recovery in the range of 99.9999%). Moreover, it should be appreciated that utilization of the additional fragments, o, facilitates faster decoding by avoiding some of the complexity of attempting decoding with a small overhead. Accordingly, embodiments of data organization techniques implemented according to the concepts herein are adapted to provide added redundant data in the source objects stored by the storage system. For example, data organization techniques in accordance with concepts herein provide a grouped symbols organization, wherein a grouped symbols organization technique of embodiments sacrifices a small increase in symbol overhead to facilitate rapid and highly reliable decoding of the source data.

In embodiments of grouped symbols organization logic, such as may be implemented by data organization logic 255, added redundant data is provided as one or more additional symbols encoded in the fragments for a source object (e.g., multiple symbols per fragment stored on a storage node). For example, additional symbols in accordance with an erasure code symbol overhead (o) may be provided according to embodiments. In operation according to embodiments, the erasure code symbol overhead, o, of a grouped symbols technique is selected to ensure high reliability decoding. Correspondingly, the number of source symbols, k, is selected according to embodiments to facilitate fast decoding of the source data. For example, in operation according to embodiments there is some number of storage nodes sk from which fragments are needed to recover a chunk of a source object, wherein receiving (portions of) fragments from these sk storage nodes corresponds to receiving k+o symbols for the source blocks of the source data to be recovered (i.e., source blocks that constitute the chunk of the source object.). Accordingly, at block 301 of flow 300 illustrated in FIG. 3A, the plurality of storage metrics obtained in accordance with an exemplary implementation of a grouped symbols organization technique may include an erasure code symbol overhead and/or a number of source symbols for facilitating rapid decoding of the source data.

In implementing embodiments of grouped symbols technique in combination with the aforementioned blob based organization technique wherein a single erasure code for a plurality of source objects or streams associated with different ones of the blob size ranges is used (e.g., at block 302 of FIG. 3A), the erasure code parameters (n; k; r) for an erasure code used in the grouped symbols implementation may be set as (n; k; =(c·sn, c·sk−o, c·(sn−sk)+o), where sk is the number of nodes from which a source object can be recovered and sn is the total number of nodes storing data for a source object. In such embodiments, the same erasure code with the same parameters (n; k; r) and overhead o can be used for more than one set of data coding parameters (sk, sn, sr) by using different values of c (the number of fragments per storage node) for each set of data coding parameters (e.g., by selecting values such that k+o is divisible by the c values of interest, since sk=(k+o)/c). It should be appreciated that in the k parameter equivalent (c·sk−o) for the grouped symbols organization technique, the erasure code symbol overhead (o) is being subtracted because when the storage system receives sk fragments, it is receiving an overhead of o over the actual source data (i.e., the source data is c·sk−o). Using such configurations of a grouped symbols organization technique, embodiments may give up a small fraction of storage capacity (e.g., 0.3%) and enable an erasure code that is not inherently MDS to perform as an MDS erasure code.

A grouped symbols organization technique may be implemented in combination with a blob based organization technique, such as through operation of data organization logic 255, to provide a blob based grouped symbols organization implementation of large erasure code storage control 250 of embodiments. For example, an exemplary blob based grouped symbols organization technique may be implemented in accordance with the flow diagram of FIG. 3B, wherein the data coding parameters according to embodiments include the parameters associated with the grouped symbols technique being implemented (e.g., a number of storage nodes source data can be recovered from, a total number of storage nodes storing data for a source object, an erasure code symbol overhead, a number of erasure coded data fragments stored per storage node for a source object, etc.). According to an embodiment wherein a single erasure code is used for a plurality of source objects or streams associated with different ones of the blob size ranges, the erasure code parameters (n; k; r) for an erasure code used in a blob based grouped symbols implementation may be set as (n; k; r)=(c·sn, c·sk−o, c·(sn−sk)+o), where sk is the number of nodes from which a source object can be recovered and sn is the total number of nodes storing data for a source object.

Table 3 below shows blob size ranges and associated data coding parameters in an exemplary blob based grouped symbols symbol organization implementation for storage nodes having a NBsize of 512 KB (e.g., HD storage nodes). In the example of Table 3, the target storage overhead (β) is 0.333, whereby the parameters provide an asymptotic storage overhead approaching this target. For the example of Table 3, the overhead o is set to 16 to ensure both high probability decoding and rapid decoding, and the total number symbol k' to use to decode is set to 1024 in this example, and thus k' is divisible by many values of c (all values of c that are powers of 2 smaller than k'), and the number of source symbols k=k'−c=1008. The c parameter represents the number of fragments per node and may be selected for each blob range. As above, the sk parameter represents the number of storage nodes from which the source object can be recovered, and thus sk=k'/c. Similarly, as above, the sn parameter represents the total number of storage nodes storing data for the source object (sr=sn−sk). An erasure code utilized by a blob based grouped symbols organization implementation may be parameterized by the data coding parameters comprising the erasure code parameters (n; k; r), the overhead parameter o, and for each blob, by it associated parameter c, and thus for the blob sk=(k+o)/c, sn=n/c. In operation, the value of sn (and thus the corresponding values of n and r) may be different for different values of c, as is the case in the examples shown in Table 3 below. However, as one skilled in the art will recognize, when using an erasure code such as the RaptorQ code (which is a fountain code), the parameter k determines the underlying (graph and algebraic) structure from which encoding and decoding properties are determined, whereas n (and r) determine how many encoded symbols to generate in total. Thus, in this sense, the same erasure code with the same parameters is used to support the different data coding parameters in Table 3.

TABLE 3

NBsize = 512 KB

| Blob Size Ranges and Associated Data Coding parameters | | | | Access Block Size and Storage Overhead | |
|---|---|---|---|---|---|
| Blob Size Range | c | sk | sn | ABsize | β |
| <4 MB | 128 | 8 | 20 | 4 MB | 0.6 |
| 4-8 MB | 64 | 16 | 32 | 8 MB | 0.5 |
| 8-16 MB | 32 | 32 | 56 | 16 MB | 0.43 |

TABLE 3-continued

NBsize = 512 KB

| Blob Size Ranges and Associated Data Coding parameters | | | | Access Block Size and Storage Overhead | |
|---|---|---|---|---|---|
| Blob Size Range | c | sk | sn | ABsize | β |
| 16-32 MB | 16 | 64 | 104 | 32 MB | 0.38 |
| 32-64 MB | 8 | 128 | 200 | 64 MB | 0.36 |
| 64-128 MB | 4 | 256 | 392 | 128 MB | 0.35 |
| 256-512 MB | 2 | 512 | 776 | 256 MB | 0.34 |
| >256 MB | 1 | 1024 | 1544 | 512 MB | 0.337 |

As above, the blob size ranges and associated data coding parameters may be selected as a function of the read unit size (NBsize) of the configuration of storage nodes upon which the data is to be stored. Note that Table 3 is consistent with Table 1, in the sense that they both support the same blob size ranges and corresponding sk and sn parameters. However, Table 3 is an example of an embodiment that combines the grouped symbols organization and the blob based data organization in which the same erasure code with the same value of k is used to support each of the eight different blob size ranges and associated data coding parameters, which is achieved by using an appropriately chosen value of c determined based on k=1008 and o=16 and the desired sk and sn parameters (which in turn depend on the blob size range). Furthermore, at least for some of the sets of parameters, the group analysis logic methods described in U. S. patent application Ser. Nos. 14/954,609 and 14/954,644, both entitled "SYSTEMS AND METHODS FOR VERIFICATION OF CODE RESILIENCY FOR DATA STORAGE," filed concurrently herewith, the disclosure of which are hereby incorporated herein by reference, can be used to determine whether with respect to the parameters whether or not the system behaves as an MDS code. For example, for the blob size range <4 MB, with sk=8, sn=20, and c=128, group analysis logic can be used to verify if all 20 choose 8 combinations of receiving the groups of 128 fragments corresponding to the groups of fragments stored on each storage node are decodable, when the ESIs for the fragments used in the construction are 0, . . . , 2559. The number of patterns of groups for which decodability is checked to verify decodability of all such patterns is 125970. If all such patterns of groups are decodable, then the derived (sk=8, sn=20) erasure code is MDS (with a reception overhead of o/(k+o)=16/1024, which is approximately 1.56%). If there are any patterns that are not decodable when using the ESIs 0, . . . , 2559, then other sets of ESIs can be used, and group analysis logic can be used to check decodability with respect to those ESIs. Similarly, for the blob size range 4-8 MB, with sk=16, sn=32, and c=64, group analysis logic can be used to verify if all 32 choose 16 combinations of receiving the groups of 64 fragments corresponding to the groups of fragments stored on each storage node are decodable, when the ESIs for the fragments used in the construction are 0, . . . , 2047. The number of patterns of groups for which decodability is checked to verify decodability of all such patterns is 601080390. For larger blob size ranges it may not be feasible to verify if all combinations of receiving groups of fragments corresponding to groups of fragments stored on each storage node are decodable, and instead extensive sampling may be performed with respect to the underlying erasure code with k=1008, with respect to patterns of fragments received as determined by the group structures of fragments received for the different blob size ranges. The group analysis logic as described herein can be performed and verified before the system is deployed.

Table 4 below shows blob size ranges and associated data coding parameters in an exemplary blob based grouped symbols organization implementation for storage nodes having a different NBsize than that of the exemplary configuration of Table 3. In particular, Table 4 shows exemplary blob size ranges and associated data coding parameters for storage nodes having NBsize of 4 KB (e.g., SSD storage nodes). In the example of Table 4, the target storage overhead (β) is again 0.333, the number of symbols (k') from which to decode is selected to be 1024 (k'=1024), the erasure code symbol overhead (o) is selected to be 16, and thus the number of source symbols is set to k=1008.

TABLE 4

NBsize = 4 KB

| Blob Size Ranges and Associated Data Coding Parameters | | | | Access Block Size and Storage Overhead | |
|---|---|---|---|---|---|
| Blob Size Range | c | sk | sn | ABsize | β |
| <32 KB | 128 | 8 | 20 | 32 KB | 0.6 |
| 32-64 KB | 64 | 16 | 32 | 64 KB | 0.5 |
| 64-128 KB | 32 | 32 | 56 | 128 KB | 0.43 |
| 128-256 KB | 16 | 64 | 104 | 256 KB | 0.38 |
| 256-512 KB | 8 | 128 | 200 | 512 KB | 0.36 |
| 512 KB-1 MB | 4 | 256 | 392 | 1 MB | 0.35 |
| 1-2 MB | 2 | 512 | 776 | 2 MB | 0.34 |
| >2 MB | 1 | 1024 | 1544 | 4 MB | 0.337 |

Note that Table 4 is consistent with Table 2, in the sense that they both support the same blob size ranges and corresponding sk and sn parameters. However, Table 4 is an example of an embodiment that combines the grouped symbols organization and the blob based data organization in which the same erasure code with the same value of k is used to support each of the eight different blob size ranges and associated data coding parameters, which is achieved by using an appropriately chosen value of c determined based on k=1008 and o=16 and the desired sk and sn parameters (which in turn depend on the blob size range). Furthermore, similar to the grouped symbols organization example as described above with reference to Table 3, at least for some of the sets of parameters described in Table 4, the group analysis logic methods described in U.S. patent application Ser. Nos. 14/954,609 and 14/954,644, both entitled "SYSTEMS AND METHODS FOR VERIFICATION OF CODE RESILIENCY FOR DATA STORAGE," filed concurrently herewith, the disclosure of which are hereby incorporated herein by reference, can be used to determine whether with respect to the parameters whether or not the system behaves as an MDS code.

In operation according to embodiments, having obtained the storage metrics and thus determined or otherwise obtained associated data coding parameters, blob based grouped symbols organization logic may proceed to receive source data, determine blob sizes with respect to the source data, and concatenate blobs into source objects/streams to store various source data within the storage nodes of storage system 200 (e.g., operation at blocks 312-314 of flow 310 shown in FIG. 3B). A plurality of fragments of particular source objects/streams will, however, be stored to the respective storage nodes. For example, in accordance with the exemplary parameters shown in Table 3 for a blob of less than 4 MB being stored to storage node configurations having a NBsize of 512 KB, 128 fragments are to be stored to each of 20 storage nodes of the storage system (any 8 storage nodes of which may be used to recover the source data), whereas for a blob of 4-8 MB 64 fragments are to be stored to each of 32 storage nodes of the storage system (any 16 storage nodes of which may be used to recover the source data). As a further example, in accordance with the exemplary parameters shown in Table 4 for a blob of less than 32 KB being stored to storage node configurations having a NBsize of 4 KB, 128 fragments are to be stored to each of 20 storage nodes of the storage system (any 8 storage nodes of which may be used to recover the source data), whereas for a blob of 32-64 KB 64 fragments are to be stored to each of 32 storage nodes of the storage system (any 16 storage nodes of which may be used to recover the source data). In each of these examples, when the sk nodes are accessed the decoder actually receives k fragments plus an additional o fragments (e.g., grouped symbols), thereby providing redundant data for decoding with high probability and for facilitating rapid decoding.

Figure 4A:
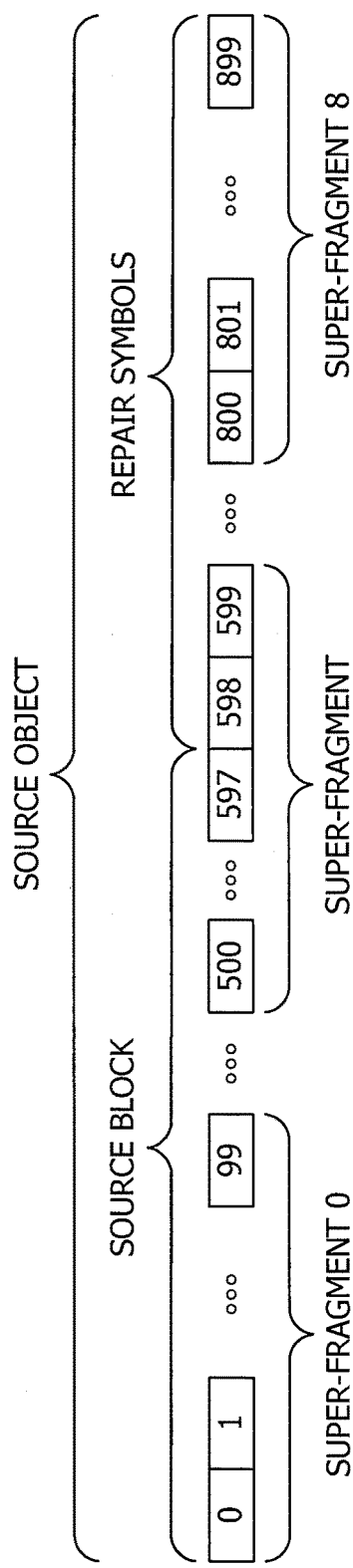
FIGS. 4A and 4B show super-fragment storage configurations as may be utilized by data organization techniques according to embodiments herein.
Figure 4B:
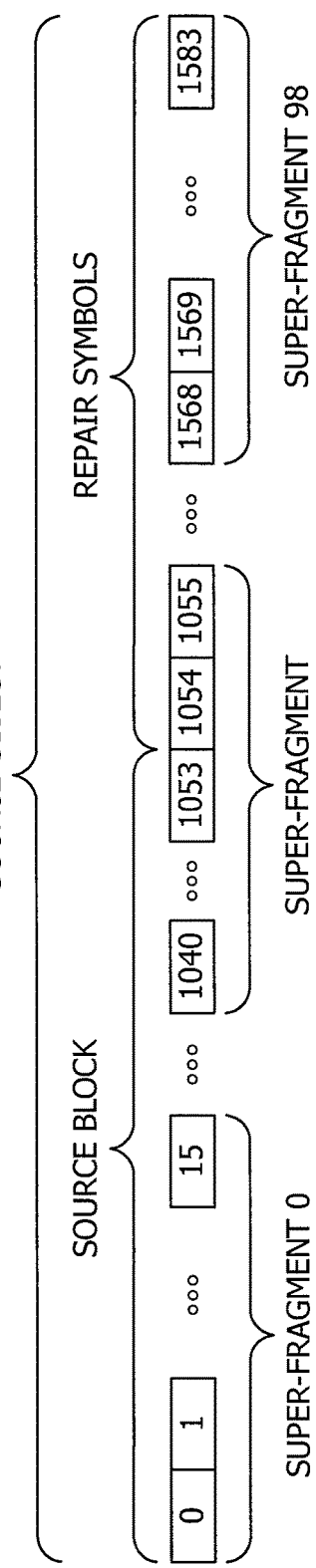

As can be seen from the above, data coding parameters for various of the blob size ranges may be different to facilitate I/O efficiency and to ensure rapid and highly reliable decoding of the source data with respect to the respective blob sizes. It should be appreciated, however, that multiple fragments per storage node may not be stored with respect to each such blob size range. The consecutive symbols associated with each source block may be aggregated and stored as a super-symbol of size c·Ssize, and thus a corresponding single super-fragment may be stored on a storage node for each source object or stream. For example, referring to Table 3, for the blob size range <4 MB with c=128, the consecutive symbols with ESIs 0, . . . , 127 may form a super-symbol that is part of a fragment that is stored on a first storage node, consecutive symbols with ESIs 128, . . . , 255 may form a super-symbol that is part of a fragment that is stored on a second storage node, etc. Examples of such super-symbol (and corresponding super-fragment) organizations are shown in FIGS. 4A and 4B. The examples above provide for storage of a single fragment per storage node (c=1) for the largest blob size range, as for these examples the number of storage nodes from which these large blobs can be recovered is equal to the number of source symbols k of the underlying erasure code, which is at least 50% I/O efficient access if the blob portions of the fragments are aligned within the node blocks (and at least 25% I/O efficient access if the fragments are not aligned within node blocks) as these large blobs are at least ABsize=k·NBsize/2 in size.

It should be appreciated from the foregoing examples that, although data coding parameters for the various blob size ranges may be different, underlying erasure code parameters remain consistent across the blob size ranges (e.g., k and o), according to embodiments. This facilitates further optimized coding design and implementation. Using the same value for Ssize (e.g., Ssize=64) bytes and k (e.g., k=1008 in the above examples) may facilitate smoother transitions when adding storage nodes. For example, in transitioning from M=384 storage nodes to M'=768 storage nodes, the change may be accommodated by a change in parameters without recoding all of the fragments (e.g., for M=384, c=4 with the erasure code parameters (1536, 1022, 514), whereas for M'=768, c=2 with the erasure code parameters remaining (1526, 1022, 514)). Thus, existing fragments may simply be copied to the appropriate storage nodes (e.g., copy fragments from Mold storage nodes to M'-M new storage nodes to spread out the source object across all M' storage nodes) when transitioning to more storage nodes. In other alternate embodiments, more than one erasure code and associated parameters (e.g., (n; k; r) parameters) may be used to support the multiple data coding parameters (e.g., sk and sn values) associated with the different storage metrics (e.g., different blob size ranges).

The storage of multiple fragments for a source object per storage node according to data organization techniques of embodiments may be stored as separate fragments on the same storage node or stored as concatenated fragments, referred to herein as a super-fragment storage configuration. FIGS. 4A and 4B, discussed in detail below, illustrate the concept of such super-fragment storage configurations. The storage of the multiple fragments per storage node as separate fragments provides a relatively simple to implement configuration providing diversity in the form of differing access speed of fragments on the same storage node. However, the use of such separate fragments may utilize more connections to the storage nodes to access the fragments. The storage of the multiple fragments per storage node as super-fragments simulates operation of a single fragment per node with MDS erasure code properties (as discussed further below). However, the implementation of such super-fragments (e.g., utilizing interleaving of fragments for each node) is more complex than storage of separate fragments per storage node.

FIG. 4A shows a super-fragment storage configuration for an embodiment where 100 fragments are stored per each of 9 storage nodes and source object (or portion thereof, e.g., a blob) can be recovered from any 6 storage nodes (c=100, sk=6 and sn=9), whereby each group of 100 fragments for a respective storage node represents a super-fragment (as also may be referred to as a super-symbol). In the configuration illustrated in FIG. 4A, the erasure code symbol overhead is selected to be 2 (o=2) and the (n, k, r) erasure code is parameterized as (900, 598, 302) (i.e., n=c·sn=100·9=900, k=c·sk-o=100·6-2=598, and r=sn-sk=302). Accordingly, each source block has 598 source fragments for which 302 repair fragments are generated. The 9 super-fragments of the illustrated embodiment are formed from concatenations of the 900 fragments, whereby super-fragment i comprises fragments 100·i, 100·i+1, . . . , 100·i+99. In operation, such an implementation provides emulation of a (9, 6) MDS erasure code (providing a loss of 1e-6 reliability as compared to a true MDS erasure code) using a (900, 598, 302) erasure code that is not inherently MDS, such as RAPTORQ.

FIG. 4B shows a super-fragment storage configuration for an embodiment where 16 fragments are stored per each of 99 storage nodes and the source object (or portion thereof, e.g., a blob) can be recovered from any 66 storage nodes (c=16, sk=66, and sn=99), whereby each group of 16 fragments for a respective storage node represents a super-fragment. In the configuration illustrated in FIG. 4B, the erasure code symbol overhead is again selected to be 2 (o=2) and the (n, k, r) erasure code is parameterized as (1584, 1054, 530) (i.e., n=c·sn=16·99=1584, k=c·sk-o=16·66-2=1054, and r=sn-sk=530). Accordingly, each source block has 1054 source fragments for which 530 repair fragments are generated. The 99 super-fragments of the illustrated embodiment are formed from concatenations of the 1584 symbols, whereby super-fragment i comprises symbols 16·i, 16·i+1, . . . , 16·i+15. In operation, such an implementation provides emulation of a (99, 66) MDS erasure code (providing a loss of 1e-6 reliability as compared to a true MDS erasure code) using a (1584, 1054, 530) erasure code that is not inherently MDS, such as RAPTORQ.

As can be seen from the example of FIG. 4A, embodiments of a data organization technique providing for multiple fragments per storage node for a source object facilitate the use of a large erasure code (that is or is not inherently MDS), with many advantages. For example, in some embodiments of a blob based data organization discussed above, different erasure codes with different parameters are used for each supported blob size range assigned to a source object or stream. However, the example of FIG. 4A, wherein multiple fragments (c) per storage node to be stored for a source object, allows using a single erasure code with a fixed number of source symbols k to support all of the different blob size ranges, as described in more detail below. This has the advantage that the overall performance, measured as encoding and decoding speed, and measured as overhead versus reliability, are much more consistent and predictable for the entire system using a single erasure code with a fixed number of source symbols as compared to using a different erasure code with a different number of source symbols for each supported blob size range. As an example of another advantage of embodiments of a data organization technique providing for multiple fragments per storage node for a source object, the number of storage nodes upon which fragments are stored for a source object or stream, and the number of storage nodes from which a source object or stream can be recovered, can be dynamically changed without requiring re-encoding or re-decoding the fragments stored in the system, as is described in more detail below.

As can also be appreciated from the examples herein, embodiments of a data organization technique providing the erasure code symbol overhead, o, of a grouped symbols technique facilitate highly reliable data recovery, approaching that of an MDS erasure code, using an erasure code which is not inherently MDS. Such an advantage is achieved with only a small loss in storage capacity (e.g., storage capacity loss of 2/600=0.3% as compared to a true MDS erasure code), and in some cases no loss in storage capacity if the large erasure code is inherently MDS. For example, as can be seen from the example of FIG. 4B, embodiments of a grouped symbols organization technique facilitate higher reliability emulations of a large erasure code (e.g., the source data can be recovered from fragments of any 66 storage nodes with a failure probability of 1e-6, as opposed to 68 storage nodes of a traditional implementation of the long erasure code), while providing a significant reduction in storage overhead (e.g., storage overhead of 0.2% as opposed to 3%).

Figures 5A, 5B:
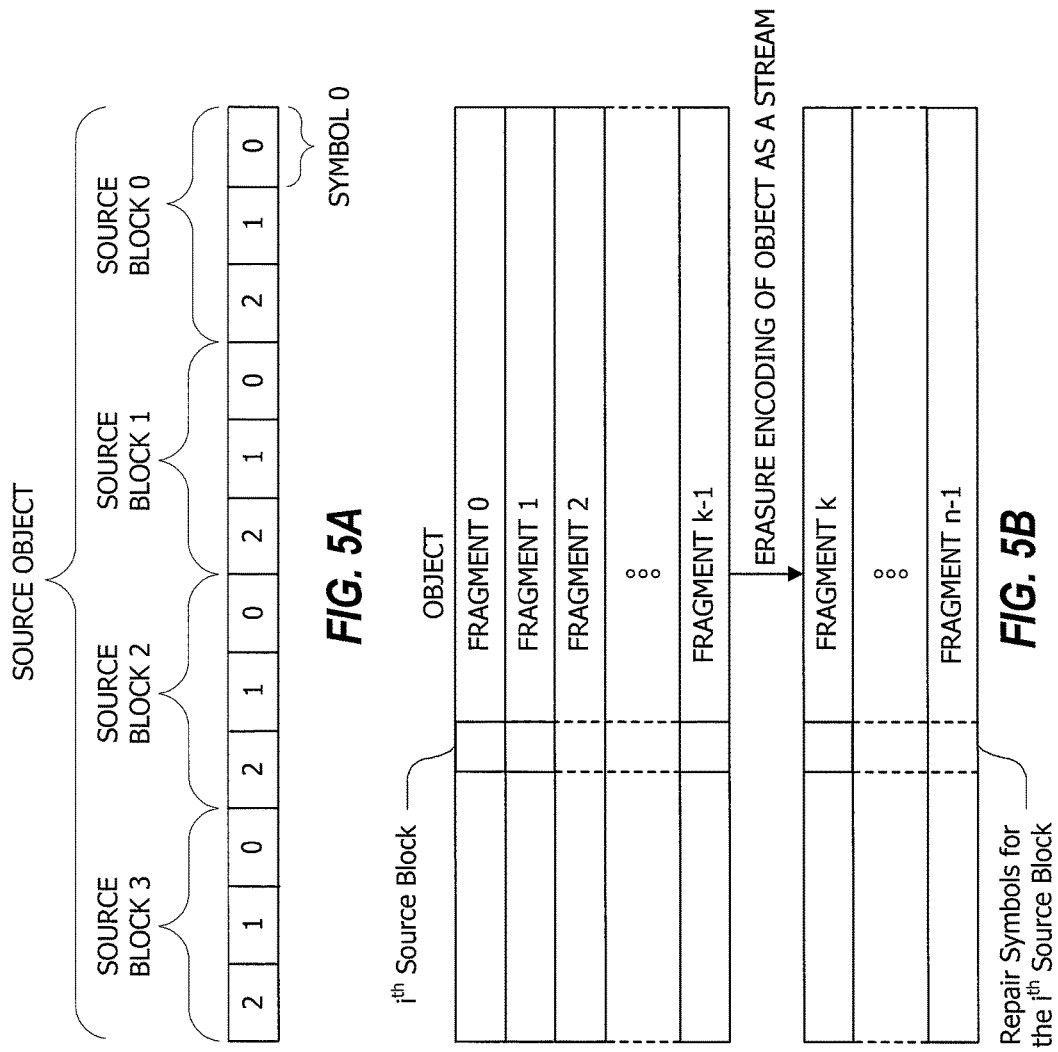
FIGS. 5A, 5B, 5D-5G show a high level representation of operation implementing a weaver data organization according to embodiments of the present disclosure.

Embodiments of data organization techniques herein may additionally or alternatively implement a data ordering organization technique, whereby the various fragments are stored in the storage nodes using a particular ordering for facilitating traffic efficiency, as well as I/O efficiency when used alone or combined with the blob based data organization described herein. FIGS. 5A, 5B, 5D-5G show a high level representation of operation implementing a data ordering organization technique, referred to herein as a weaver data organization technique, according to embodiments herein. The diagram of FIG. 5A shows a representation of a source object partitioned into source blocks and source fragments, wherein source fragment i comprises a concatenation of symbol i from the source blocks in the source object according to an embodiment of the weaver data organization. Referring to FIG. 5B, the $i^{th}$ symbol from source Fragment 0 (which has ESI=0), the $i^{th}$ symbol from source Fragment 1 (which has ESI=1), the $i^{th}$ symbol from source Fragment 2 (which has ESI=2), . . . and the $i^{th}$ symbol from source Fragment k−1 (which has ESI=k−1) are used to generate the $i^{th}$ symbols for Fragments k, k+1, . . . , n−1 (with corresponding ESIs=k, k+1, n−1). This is repeated, using a next symbol of the source Fragments 0, 1, . . . , k−1 to generate a next symbol for each of the repair fragments (e.g., Fragments k, k+1, . . . , n−1). As can be appreciated from the foregoing, the $i^{th}$ symbol from each source block is put into Fragment i.

In the embodiment of the weaver data structure illustrated in FIG. 5A, the source object size is much greater than the source block size, where Bsize is the size of the source block in bytes and Osize is the size of the object in bytes, and thus Bsize<<Osize and the node block size (i.e., the size of a typical fast read) is much greater than the number of bytes in a symbol, where Ssize is the size of a symbol in bytes and NBsize is the size of a node block in bytes (the node block being the efficient read unit of data from the storage nodes, e.g., 500 bytes to hundreds of kilobytes depending upon the particular storage technology), and thus Ssize<<NBsize.

Figure 5C:
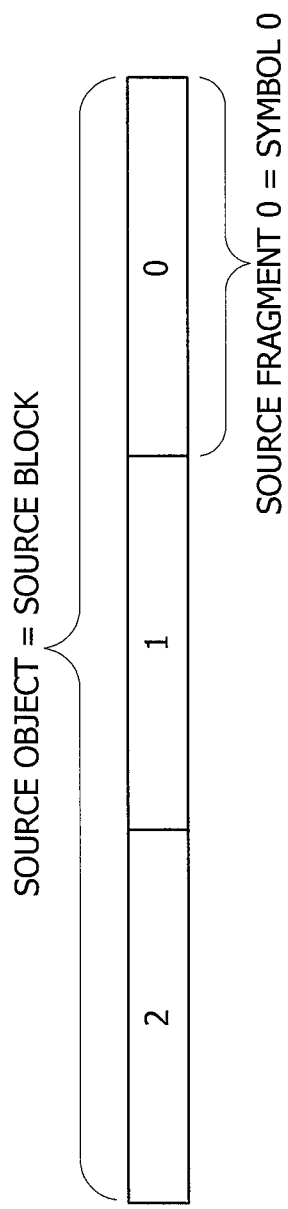
FIG. 5C shows a traditional data organization providing fragments comprised of blocks of contiguous bytes from the source data.

In contrast to the concatenated configuration provided by the weaver data structure, the traditional data structure provides fragments comprised of blocks of contiguous bytes from the source data (e.g., source fragment 0=symbol 0 from the source block), as illustrated in the diagram of FIG. 5C. It should be appreciated that in the data structure illustrated in FIG. 5C, the source object size and source block size are equal (Bsize=Osize) while the number of bytes in a symbol is much greater than the node block size (Ssize>>NBsize).

Figure 5D:
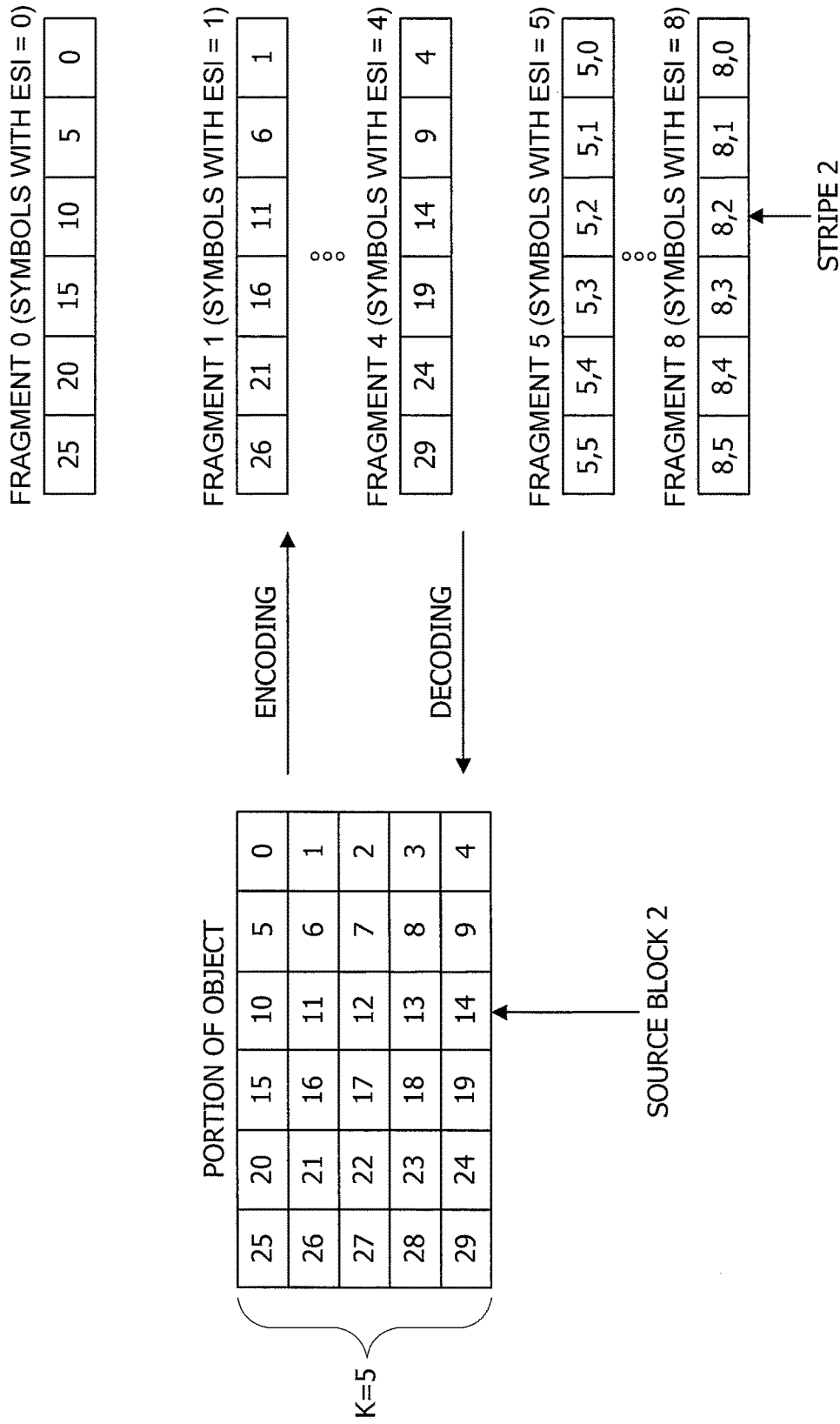

Encoding and decoding of data using the weaver data organization is illustrated in FIG. 5D, wherein the number of source symbols per source block, k, is represented as being 5 and each box contains Ssize bytes of data (i.e., each box contains one symbol of data). As can be seen in the example of FIG. 5D, each column in the source object represented on the left of the figure comprises a source block (i.e., a source block comprising k source symbols). In FIG. 5D, the order of the data in the source object is represented by the number label in each box (i.e., the data in the box labeled 0 comprises the first Ssize bytes of the source object, followed by each of the Ssize bytes of data in the boxes labeled 1, 2, 3, . . . , 29). Moving across the rows of the source object represented on the left of the figure, the symbols of different source fragments are utilized to generate each repair symbol of each corresponding repair fragment (e.g., using RaptorQ encoding) shown on the right of the figure, when the object is first stored in the storage system. For each source block, additional repair symbols are also generated according to embodiments, as represented by Fragment 5 through Fragment 8 of the illustrated embodiment (of which Fragment 5 and Fragment 8 are shown). In the illustrated example, source symbols are indexed from 0 to k−1 and repair symbols are indexed from k to n−1. Fragment 0 of FIG. 5D corresponds to the symbols from each of the source bocks in the correct order with encoding of symbol ID as 0 (i.e., the first row of source symbols in the source object shown on the left of the figure). For the illustrated repair fragments, the first index value shown in the boxes representing the symbols is the encoding symbol ID (e.g., 5 for Fragment 5) and the second index value is the source block number (e.g., 0, 1, 2, 3, . . . ).

Figure 5E:
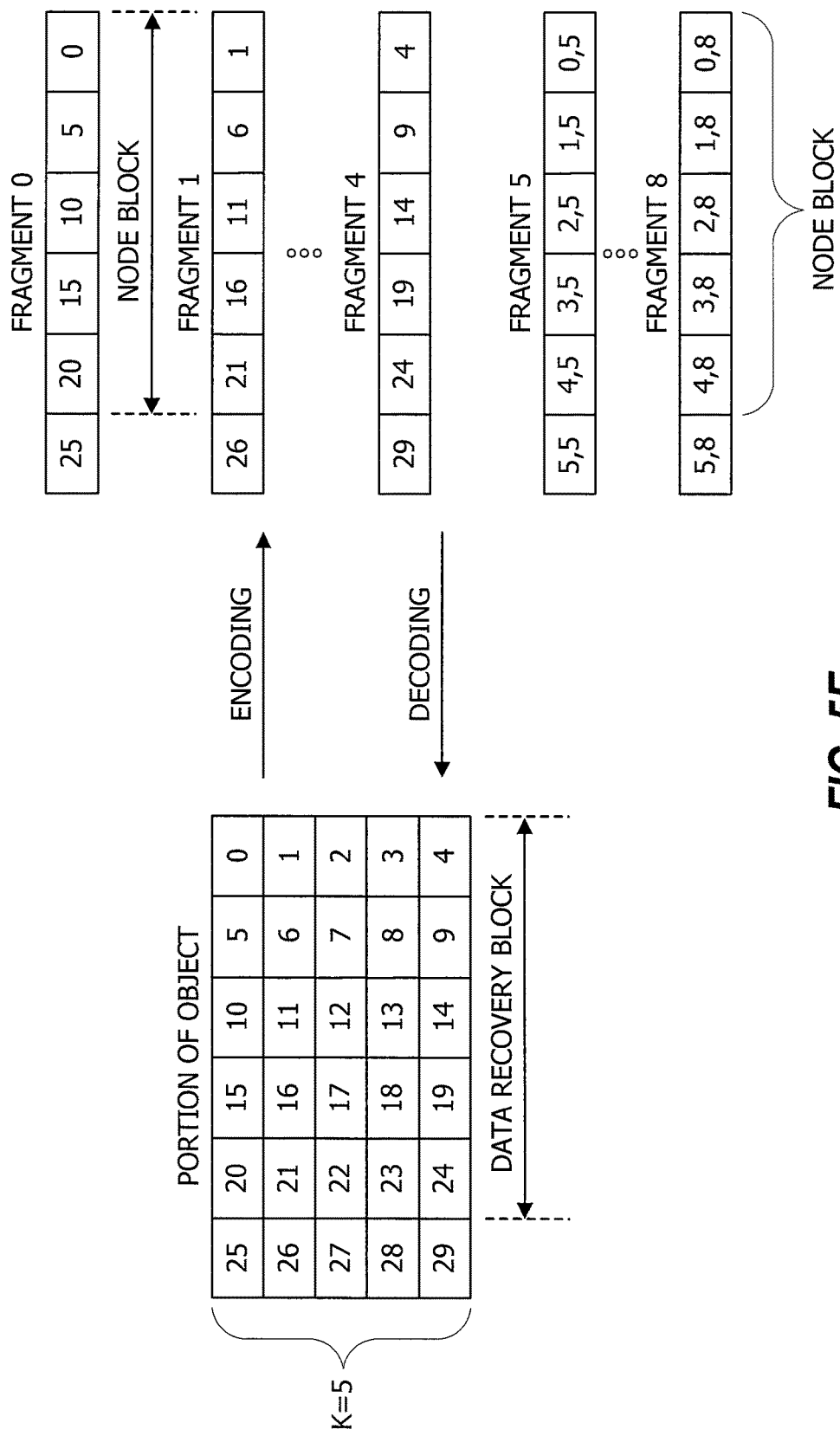

In the embodiment illustrated in FIG. 5E, the node block size, NBsize, is the amount of data that can be efficiently read from the storage nodes in a single read operation, the number of source symbols in a source block, k, is represented as being 5, and each box representing a symbol contains Ssize bytes of data. As can be seen in the example embodiment, the node block size, NBsize, may be appreciably larger than the symbol size, in contrast to typical data structures in which the node block size is much smaller than the source symbol size. Accordingly, in this example, 5 symbols of a fragment may be read from the storage nodes at a time, whereby k·NBsize is the data recovery block size.

As an example implementation of a weaver data structure, Ssize=64 bytes is a suitable size for symbols in some embodiments, as then each symbol may be operated on efficiently in some CPU architectures, as 64 bytes may be the size of a cache line, or may be the amount of data that may fit conveniently in a CPU register. In this case, if for example the number of source symbols k=1024, then Bsize=k·Ssize=64 Kilobytes. The value of Bsize is also convenient for some CPU architectures, as it is often the case that 64 Kilobytes of data can easily fit into the fastest cache available to the CPU, which expedites fast access to all symbols of the source block during the encoding and decoding process, leading to very fast erasure encoding and decoding speeds. For example, for an implementation of the RaptorQ erasure code described in IETF RFC 6330, encoding and decoding speeds in the range of several Gigabits per second are achieved using a single CPU on a standard server architecture. For a FLASH based storage node architecture, the value of NBsize might be 8 Kilobytes, and thus Ssize<<NBsize, and the data recovery block size in this example is k·NBsize=8 Megabytes. In this same example, the size of source objects, Osize, may be 1 Gigabyte, and thus Bsize is a very small fraction of Osize (i.e., Bsize/Osize=0.000061).

The access properties of a storage system, such as a storage system configured in accordance with the above example referencing an implementation of an AZURE cloud platform available from Microsoft Corporation, but which implements a weaver data structure in accordance with the concepts herein provides for reading L bytes of data from the storage nodes to access L bytes of source data, independent of the state of the storage nodes. In particular, to recover data from any k fragments on available storage nodes, L/k bytes may be read from at least k fragments and L bytes of source data decoded (e.g., using RaptorQ decoding), whereby f(L)=k·L/k=L. Moreover, the read succeeds even if some fragments are unavailable (e.g., due to failed storage nodes) or where some data is slow to arrive, such as by reading data from more than k fragments according to embodiments (e.g., embodiments may operate to read the L desired bytes from more than k fragments to facilitate successful, efficient reads even when storage nodes have failed or data is otherwise delayed when returned). Accordingly, implementation of a weaver data structure facilities operation in which read speed is independent of storage node availability and provides more availability. Additionally, data may be encoded/decoded incrementally (e.g., one source block at a time). Such operation may reduce encode/decode latency (e.g., encode/decode latency sometimes associated with large erasure codes, such as RaptorQ) and facilitates optimized CPU/cache encoding/decoding workflow. Such incremental encoding/decoding facilitates near immediate data availability.

Figure 5F:
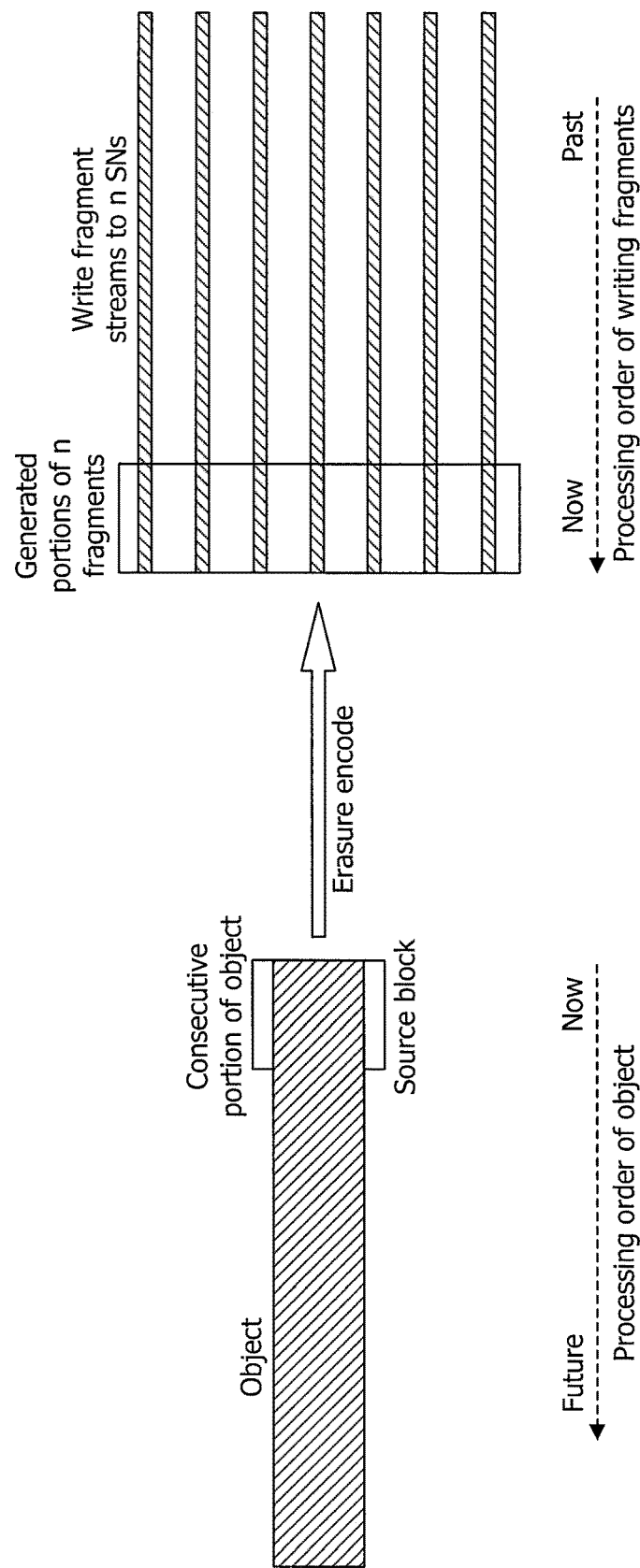
Figure 5G:
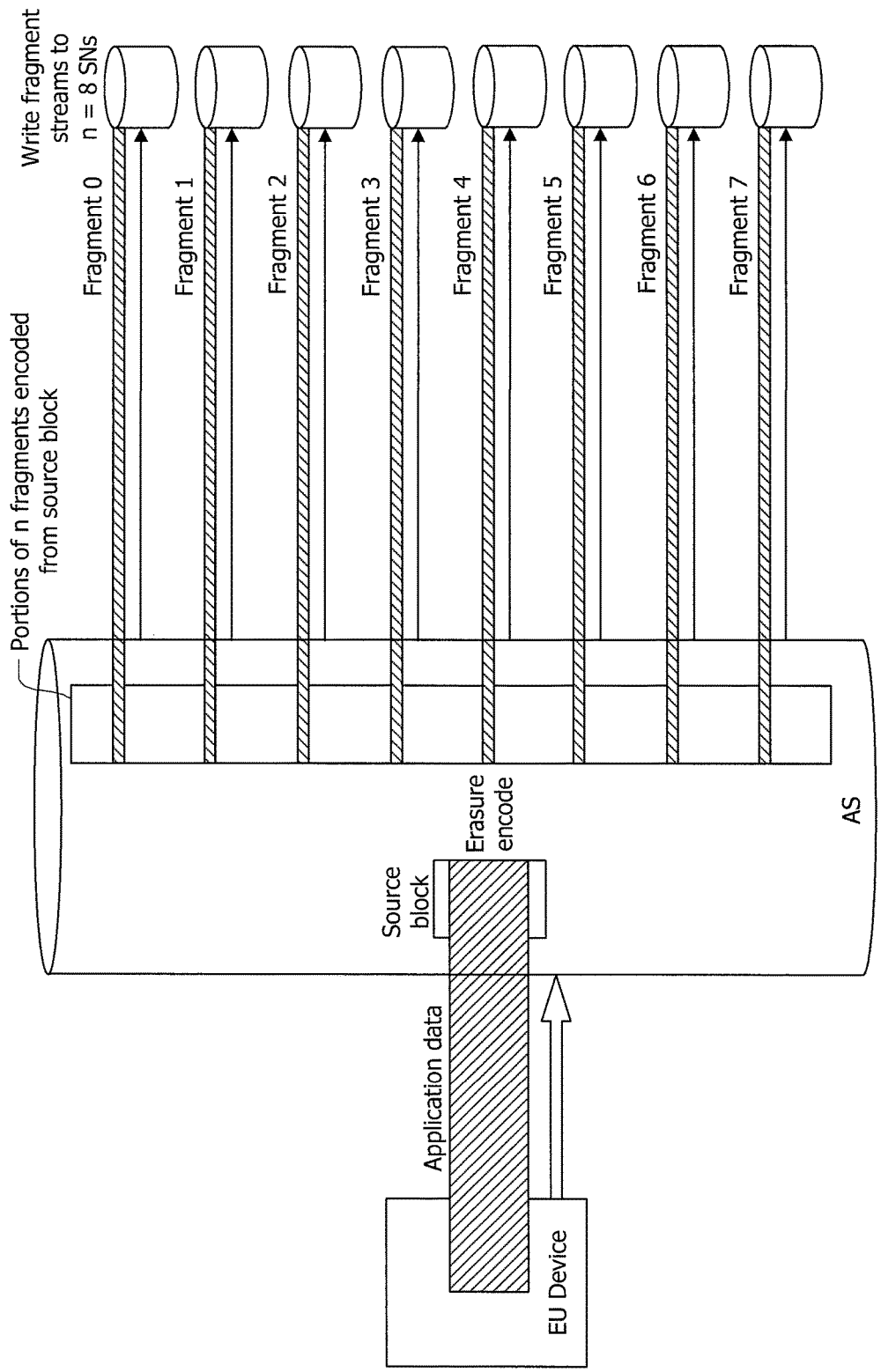

FIG. 5F shows operation utilizing a weaver data structure according to embodiments to provide stream encoding as described above. In the illustration of FIG. 5F, as the data of the source object moves from left to right the source blocks are erasure encoded and written to the storage nodes. Because the source block is a relatively small portion of the source object, this portion may be encoded and streamed to the different fragments that may then be written to the storage nodes immediately (or perhaps cached locally to collect a portion of each fragment which may be written to the storage node efficiently). This stream encoding is shown in the context of an exemplary storage system in the illustration of FIG. 5G, wherein the data is arriving from the EU device, whereby each source block is erasure encoded into the different portions of the fragments that are written to the storage nodes. It should be appreciated that, although a single connection is shown between the access server and each of the storage nodes in FIG. 5G, embodiments herein may utilize multiple connections between an access server and storage node for uploading data of fragments to the storage node.

The foregoing weaver data organization techniques provides excellent access efficiency for any erasure code solution, particularly large erasure code solutions, as well as enables streaming erasure encoding of source data rather than the block encoding of typical data organization techniques. Using a large erasure code solution with the weaver data organization maintains all of the advantages of large erasure code solutions over small erasure code solutions in terms of reliability, storage overhead, and repair bandwidth, while at the same time providing excellent access efficiency. Further detail regarding the implementation and operation of such weaver data organization techniques by a storage system is provided in U.S. patent application Ser. No. 14/567,303 entitled "SYSTEMS AND METHODS FOR RELIABLY STORING DATA USING LIQUID DISTRIBUTED STORAGE," filed Dec. 11, 2014, the disclosure of which is hereby incorporated herein by reference.

The weaver data organization and the blob based data organization can be advantageously combined, and a further refinement combining with the grouped symbols data organization provides additional benefits. As an example of the combination of all three data organizations, consider a weaver data organization combined with the combination of a grouped symbols and a blob based data organization as shown in Table 4. In general, it is preferable if the super-symbol size c·Ssize is at most the size of an efficient read NBsize from a storage node, and thus for the example in Table 4, a suitable symbol size is Ssize=32 bytes since the largest value of c is 128 and NBsize=4096 bytes. A weaver data organization may be used for each of the eight different blob size ranges, using an erasure code with k=1008, o=16, k'=1024, and Ssize=32 bytes, and thus each stream may be partitioned into source blocks of size k·Ssize=32256 bytes, whereby encoded symbols are generated for each source block (e.g., as the data arrives for the source block in a stream). Then, depending on the value of c associated with the stream, the encoded symbols may be grouped into consecutive sets of c symbols each to form super-symbols, and each super-symbol may be appended to the appropriate super-fragment stream of data to be written to a particular storage node. For example, for the stream associated with blobs of size <32 KB in Table 4 corresponding to c=128, the first 128 symbols (with ESIs 0, . . . , 127) of each source block are grouped to form a super-symbol of size c·Ssize=4096 bytes which are streamed to be stored on a first storage node, and the next 128 symbols (with ESIs 128, . . . , 255) of each source block may be grouped to form a super-symbol of size 4096 bytes which are streamed to be stored on a second storage node, and this continues for sn=20 storage nodes. As another example, for the stream associated with blobs of size 32-64 KB in Table 4 corresponding to c=64, the first 64 symbols (with ESIs 0, . . . , 63) of each source block may be grouped to form a super-symbol of size c·Ssize=2048 bytes which are streamed to be stored on a first storage node, and the next 64 symbols (with ESIs 64, . . . , 127) of each source block may be grouped to form a super-symbol of size 2048 bytes which are streamed to be stored on a second storage node, and this continues for sn=32 storage nodes. Alternatively, the symbol size Ssize may be adjusted based on the value of c so that for example c·Ssize=4096 bytes for each value of c (i.e., for c=128 the value of Ssize is set to 32 bytes, for c=64 the value of Ssize is set to 64 bytes, for c=32 the value of Ssize is set to 128 bytes, etc). Note that in this alternative, even though the symbol size varies for each value of c, the same values are used for the data coding parameters k and o, and thus the underlying recovery properties of the erasure code are the same for each value of c.

As another example of the combination of all three data organizations, consider a weaver data organization combined with the combination of a grouped symbols and a blob based data organization as shown in Table 3. A suitable symbol size is Ssize=4096 bytes since the largest value of c is 128 and NBsize=512 KB. A weaver data organization may be used for each of the eight different blob size ranges, using an erasure code with k=1008, o=16, k'=1024, and Ssize=4096 bytes, and thus each stream may be partitioned into source blocks of size k·Ssize=4128768 bytes, whereby encoded symbols are generated for each source block (e.g., as the data arrives for the source block in a stream). Then, depending on the value of c associated with the stream, the encoded symbols may be grouped into consecutive sets of c symbols each to form super-symbols, and each super-symbol may be appended to the appropriate super-fragment stream of data to be written to a particular storage node. For example, for the stream associated with blobs of size <4 MB in Table 3 corresponding to c=128, the first 128 symbols (with ESIs 0, . . . , 127) of each source block may be grouped to form a super-symbol of size c·Ssize=524288 bytes which are streamed to be stored on a first storage node, and the next 128 symbols (with ESIs 128, . . . , 255) of each source block may be grouped to form a super-symbol of size 524288 bytes which are streamed to be stored on a second storage node, and this continues for sn=20 storage nodes. As another example, for the stream associated with blobs of size 4-8 MB in Table 3 corresponding to c=64, the first 64 symbols (with ESIs 0, . . . , 63) of each source block may be grouped to form a super-symbol of size c·Ssize=262144 bytes which are streamed to be stored on a first storage node, and the next 64 symbols (with ESIs 64, . . . , 127) of each source block are grouped to form a super-symbol of size 262144 bytes which are streamed to be stored on a second storage node, and this continues for sn=32 storage nodes. Alternatively, a smaller fixed value for Ssize may be used for all values of c, wherein the fixed value for Ssize is chosen so that the largest value of c times Ssize is at most NBsize (e.g., Ssize=64 bytes is appropriate since 128·64=8096 bytes is smaller than NBsize=524288 bytes in this example). This alternative may be preferable in some cases as the amount of memory needed for encoding and decoding can be smaller.

In contrast to the streaming organization of a weaver data organization as discussed above, data organization implemented according to traditional small erasure codes organizes the data as if accessing a segment from a source object will be accomplished through accessing a single storage node. Although this may result in I/O inefficiencies when accessing data from the source object within a fragment that is currently missing (for example because the storage node the fragment is stored on recently failed), such an organization may nevertheless allow accessing reasonably small portions of data from a source fragment on a single storage node in some situations. Data organization techniques herein, such as the above described grouped symbols organization wherein multiple fragments per storage node are stored for a source object, may be utilized to make the number of storage nodes used with respect to a large erasure code smaller, and thus facilitate improved I/O efficiencies with respect to accessing reasonably small portions of data (e.g., simulating features of a small erasure code). A variation on the foregoing weaver data organization, referred to herein as the grouped symbol weaver data organization, combines the weaver data organization with a grouped symbol organization and provides a data ordering organization for I/O efficient access for reasonably small portions of data. Grouped symbol weaver data organization techniques of embodiments provide some depth of fragment storage within the storage nodes for a source object, instead of streaming the fragments for a source object storage node by storage node.

Figure 6A:
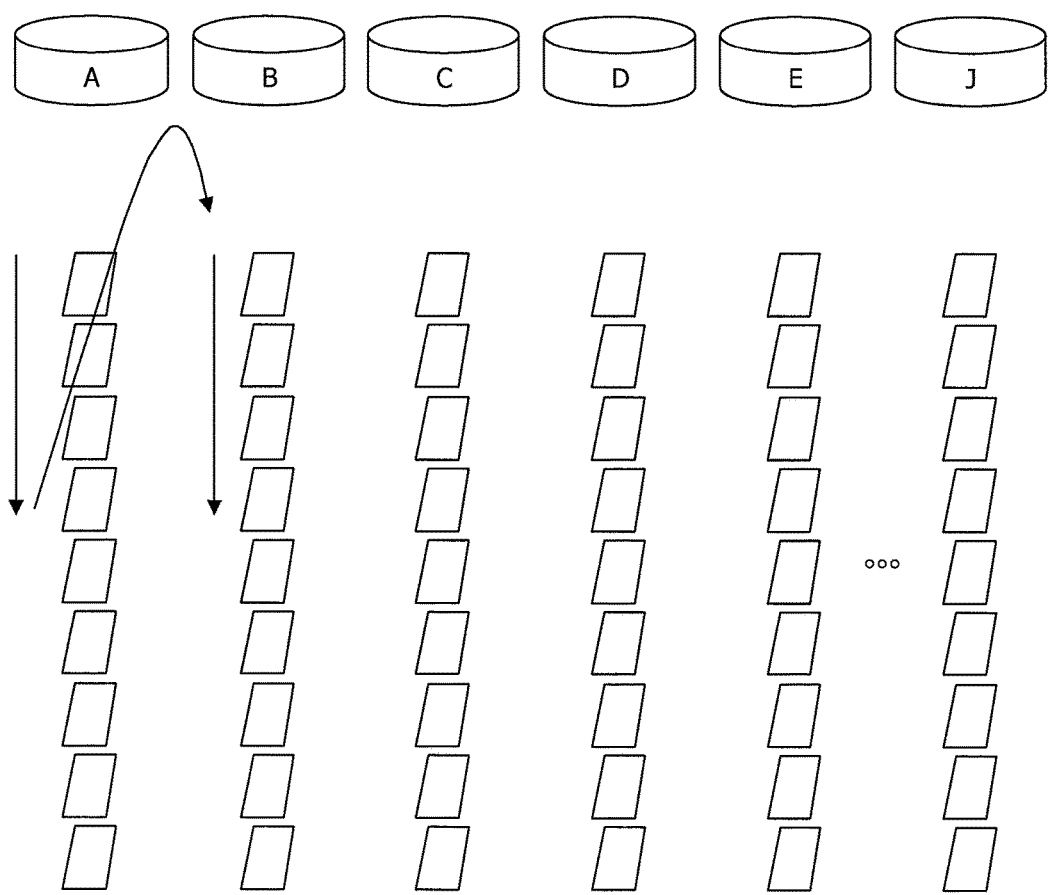
FIGS. 6A-6C show storage of fragments according to data organization techniques of embodiments herein.
Figure 6B:
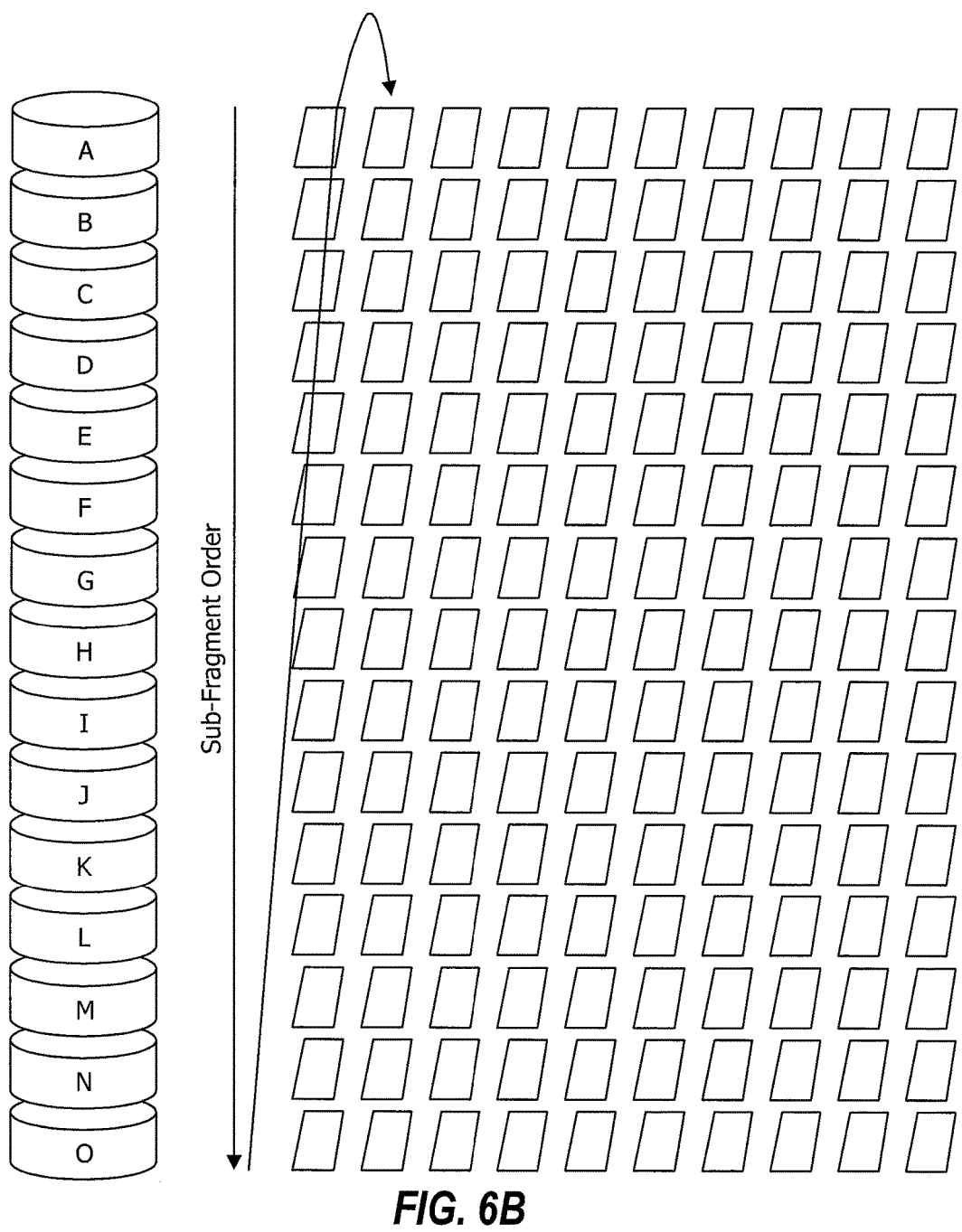

FIG. 6A illustrates operation of a grouped symbol weaver data organization technique according to embodiments herein. It is helpful in understanding the grouped symbol weaver data organization to compare this variation to the above described weaver data organization, as illustrated at a high level in FIG. 6B. As shown in FIG. 6B, a weaver data organization may stream objects out a layer at a time across the storage nodes. In contrast, a grouped symbol weaver data organization orders the data such that a significant number of the fragments are stored to a same storage node before the stream moves to storage of fragments to another storage node. For example, where an efficient read block size (e.g., NBsize) is c=4 symbols, an implementation of the grouped symbol weaver data organization may operate to order data so that 4 symbols in sequence are written to a single storage node, as shown in the embodiment illustrated in FIG. 6A. For the grouped symbol weaver data organization, one alternative is to choose the group size c and symbol size Ssize so that c·Ssize is at least a significant fraction of NBsize, which ensures that reading source data from a storage node directly will trigger the storage node to read blocks of data from its local storage in sizes that are a significant fraction of the efficient block read size NBsize. Additionally, the minimum size of a blob may be used as an additional criteria for choosing c and Ssize (e.g., c·Ssize may be chosen so that it is a significant fraction of the maximum of NBsize and the minimum size of data that is accessed). Furthermore, the blob based data organization may be combined with the grouped symbol weaver data organization so that for example blobs of different ranges sizes, corresponding to different values of source data metrics, may determine which types of storage devices (based on storage device metrics) and data coding parameters are appropriate for storing those blobs. Thus, accesses to a reasonably small portion of source data in some cases may be accommodated by accessing the fragments of a single storage node. That is, where the blobs contain smaller objects therein (e.g., individual electronic photographs, electronic documents, etc.), operation of a grouped symbol weaver data organization technique of embodiments stores the fragments in the storage system in such a way that typical small portions of the source data may be accessed from a single storage node.

Figure 6C:
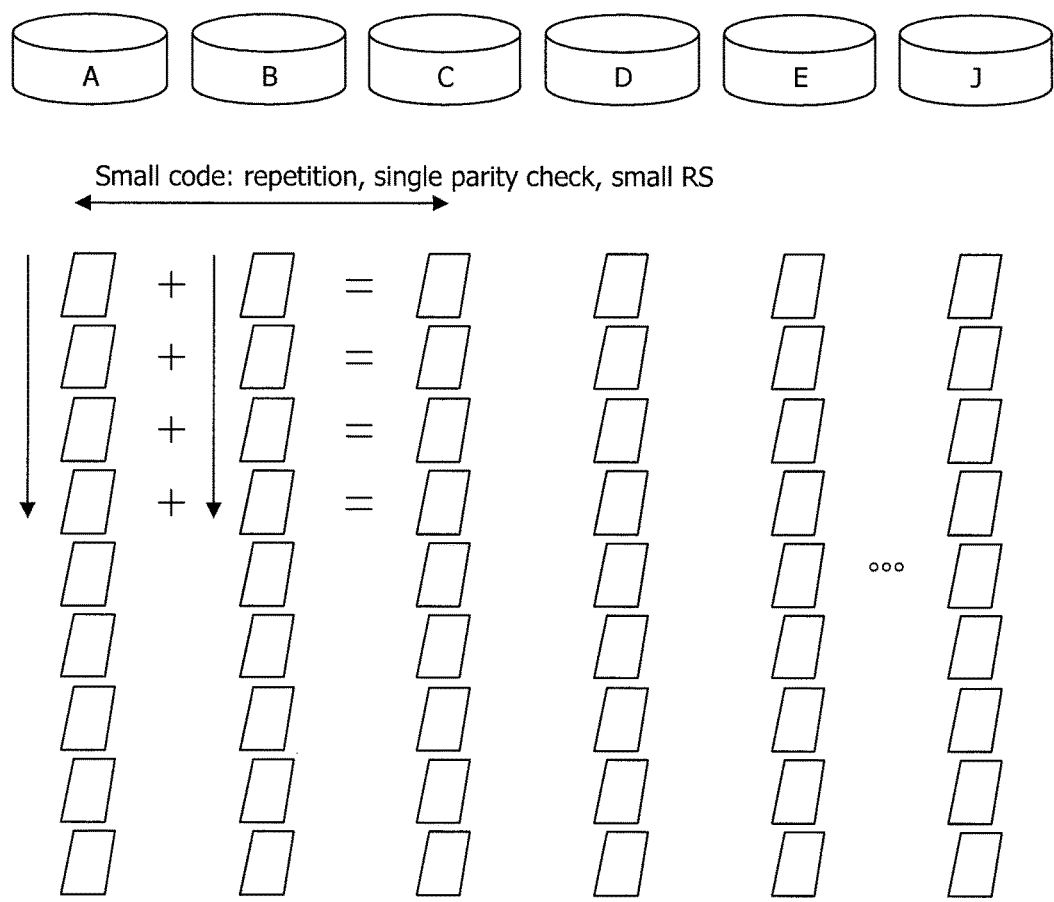

A variation on the grouped symbol weaver data organization technique according to embodiments is shown in FIG. 6C. In understanding the embodiment of FIG. 6C, it is helpful to remember that small erasure codes, although facilitating access to reasonably small portions of data from a single node in some situations, present challenges with respect to repair bandwidth. That is, because the small erasure codes have a relatively small number of fragments, when only a very few fragments are lost (e.g., even as few as 1), repair processing must be initiated rapidly in order to avoid the risk of the source data becoming unrecoverable (e.g., presenting disruptive spikes in storage system bandwidth utilization). The use of large erasure codes with a lazy repair policy, such as in a liquid distributed storage control technique herein, avoids this issue as the source data is not in immediate danger of data loss when a small number of fragments are lost. Accordingly, the grouped symbol weaver data organization technique of the embodiment shown in FIG. 6C provides a hybrid grouped symbol weaver data organization configuration in which a large erasure code is used as an outer code and a small erasure code is used as an inner code. In such an embodiment, the inner code can be used to provide resiliency of local small data access against storage node loss (e.g., any of storage nodes A, B, or C may be lost without sacrificing local access of the fragments stored by those storage nodes). The outer code of such an embodiment provides for repair of the source object so that no repair process need be initiated with respect to the inner code (e.g., no immediate repair policy needs to be implemented with respect to the small erasure code as the large erasure code provides continued viability of the source data for the source object).

In operation of a hybrid grouped symbol weaver data organization according to embodiments, a large erasure code, such as RAPTORQ, is utilized as the outer code. This large erasure code may be utilized to store the source objects in the aforementioned hybrid grouped symbol weaver data organization. The fragments within this data organization, however, are further encoded according to embodiments using an inner code. In operation of the hybrid grouped symbol weaver data organization according to an exemplary embodiment is a parity check. For example, as shown in FIG. 6C, 8 fragments may be stored c=4 deep on each of 2 storage nodes (storage nodes A and B), whereas a third storage node (storage node C) stores parity check bit sets for fragment pairs stored by the other storage nodes (e.g., each fragment pair from storage nodes A and B). If a user requests a portion of data that is contained in any of the 4 fragments stored on either storage node A or storage node B in the foregoing example, that data access may be served by accessing that single storage node. If the fragment is lost, it may be immediately repaired through use of the inner code (e.g., accessing the other fragment of the pair and the corresponding parity bit set). If, however, the data of the lost fragment is not accessed, embodiments may not initiate a rapid repair policy with respect to the inner code, but instead leave the lost fragment to be repaired through the repair policy of the outer code (e.g., by operation of the above described lazy repair policy). That is, data that is accessed frequently would be kept intact through operation of the inner code, whereas overall the entire data remains more highly protected from loss through operation of the outer code and a lazy repair policy. Accordingly, repair bandwidth efficiency may be maintained while nevertheless facilitating I/O efficiency with respect to reasonably small portions of source data by operation of embodiments of such a hybrid grouped symbol weaver data organization. As an alternative, data accessed through the operation of the inner code can be repaired during the access. For example, suppose node A fails and a replacement node A' is added to the system. Then, to access data originally stored on node A before it failed, instead the corresponding portions of data are accessed from nodes B and C and the data is reconstructed using the inner code. Once the data is reconstructed (what was originally stored on A) can then also be written to node A', thus repairing this portion of the data on A' using the inner code. As another alternative, proactive inner code repair may also be used in operation (e.g., repairing data lost from a node using the inner code even if the corresponding data is not accessed). As another alternative, the above embodiments can also use a grouping of c=1 (i.e., an embodiment of a hybrid weaver data organization that does not used grouped symbols).

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method implemented by processor-based logic of a storage system storing source data as a plurality of erasure coded fragments on storage nodes of the storage system, the method comprising:

obtaining storage device metric values for a storage node configuration of a plurality of storage nodes of the storage nodes of the storage system, wherein the storage device metric values for the storage node configuration include a storage node read unit size value, a target storage overhead value, and a plurality of blob size ranges corresponding to groups of application data chunks that are accessed together;

encoding the source data to provide erasure coded fragments for storage on storage nodes of the storage system having the storage node configuration using an erasure code parameterized with data coding parameter values including a number of storage nodes from which a blob of source data in a respective blob size range of the plurality of blob size ranges can be recovered value and an erasure code symbol overhead value based at least in part on the storage device metric values for the respective blob size range, wherein the data coding parameter values are selected for the respective blob size range to provide the erasure coded fragments configured for I/O access efficiency measured as an amount of data read from the storage nodes to access a given portion of source data, and wherein the erasure code symbol overhead value is selected to be large enough to ensure rapid decoding of the blob of source data from a number of fragments equal to the number of storage nodes from which blobs of source data are recovered value or to be large enough to ensure high reliability decoding of the blob of source data from a number of fragments equal to the number of storage nodes from which blobs of source data are recovered value; and storing, under control of the logic of the storage system, the erasure coded fragments of the source data on storage nodes of the plurality of storage nodes, wherein the erasure coded fragments are configured to facilitate the I/O access providing I/O access efficiency in the storage system using the erasure code parameterized with the data coding parameter values for the respective blob size range for blobs of source data identified in the source data.

2. The method of claim 1, wherein the data coding parameter values are selected for blob size ranges of the plurality of blob size ranges, wherein the data coding parameter values for a blob size range of the blob size ranges comprises a total number of storage nodes storing data for blobs within the blob size range of the plurality of blob size ranges.

3. The method of claim 2, wherein source data metric values are associated with the source data, wherein the data coding parameter values selected for a first blob size range of the plurality of blob size ranges associated with first source data metric values is different than the data coding parameter values selected for a second blob size range of the blob size ranges associated with second source data metric values, wherein the first source data metric values and the second source data metric values are different.

4. The method of claim 2, wherein source data metric values are associated with the source data, wherein the source data metric values associated with the source data comprise a respective blob size corresponding to application data chunks that are accessed together.

5. The method of claim 1, wherein source data metric values are associated with the source data, wherein different sets of values for a first set of the data coding parameter values are provided for a blob size range of the plurality of blob size ranges corresponding to a respective one of the source data metric values than for blob size ranges of the plurality of blob size ranges corresponding to other respective ones of the source data metric values, and wherein a same set of values for a second set of the data coding parameter values are provided for the blob size range corresponding to the respective one of a plurality of source data metrics as for the blob size ranges corresponding to the other respective ones of the source data metric values.

6. The method of claim 5, wherein the plurality of source data metrics comprise a plurality of efficient access block sizes for the chunks of source data.

7. The method of claim 6, wherein an efficient access block size of the plurality of efficient access block sizes is determined for a respective blob size range of the plurality of blob size ranges based on a typical size of data accessed within the source data.

8. The method of claim 5, wherein the first set of data coding parameters comprise a number of fragments stored per storage node value.

9. The method of claim 8, wherein the second set of data coding parameters comprise a number of source symbols used by the erasure code value, wherein the number of source symbols used by the erasure code is a minimal number of fragments needed to recover blobs of source data.

10. The method of claim 9, wherein the first set of data coding parameters comprise a number of storage nodes from which a blob of source data in a respective blob size range of the plurality of blob size ranges can be recovered value, wherein the second set of data coding parameters further comprise the erasure code symbol overhead value, wherein a sum of the erasure code symbol overhead value and the number of source symbols used by the erasure code value is equal to a number of storage nodes from which the blob of source data are recovered value.

11. The method of claim 10, wherein the erasure code symbol overhead value is selected to be a small fraction of the number of source symbols used by the erasure code value.

12. The method of claim 5, wherein the first set of data coding parameters comprise the number of storage nodes from which a blob of source data in a respective blob size range of the plurality of blob size ranges can be recovered value.

13. The method of claim 5, wherein the first set of data coding parameters comprise a number of storage nodes on which data for a blob of source data in a respective blob size range of the plurality of blob size ranges is stored value.

14. The method of claim 1, further comprising:
obtaining the plurality of blob size ranges for storage of the erasure coded fragments within the storage system, wherein each blob size range of the plurality of blob size ranges has respective data coding parameter values for use in generating erasure coded fragments from blobs of source data having a size corresponding to a respective blob size range of the plurality of blob size ranges, wherein a same set of values for a plurality of the data coding parameter values are used for different blob size ranges of the plurality of blob size ranges.

15. The method of claim 14, wherein the storage device metric values comprise a storage node read unit size.

16. The method of claim 15, wherein the data coding parameter values further comprise a number of fragments stored per storage node value, wherein the number of fragments per storage node value are different for a first blob size range and a second blob size range of the plurality of blob size ranges.

17. The method of claim 16, wherein the number of fragments per storage node value for blobs in the blob size range for at least one blob size range of the plurality of blob size ranges is selected to provide emulation of a maximum distance separable (MDS) erasure code for an erasure code that is not inherently MDS.

18. The method of claim 15, wherein a first storage node read unit size of the storage device metric values comprises an efficient read unit of data from storage nodes of the storage node configuration.

19. The method of claim 18, further comprising:
obtaining at least one storage metric value associated with the storing of the source data as the plurality of erasure coded fragments in addition to the first storage node read unit size, wherein the data coding parameter values are parameterized based at least in part on the first storage node read unit size and the at least one storage metric value.

20. The method of claim 19, wherein the at least one storage metric value includes a storage device metric value in addition to the first storage node read unit size, wherein the data coding parameter values selected for a blob of source data associated with a first value of the storage device metric value is different than the data coding parameter values selected for a blob of source data associated with a second value of the storage device metric values.

21. The method of claim 20, wherein the storage device metric value comprises one or more storage device metric values selected from the group consisting of a target storage overhead and a second storage node read unit size for a second storage node configuration of storage nodes of the storage system.

22. The method of claim 19, wherein the at least one storage metric value includes a source data metric value for source data stored by the storage system, wherein the data coding parameter values selected for a blob size range of the plurality of blob size ranges associated with a first value of the source data metric value is different than the data coding parameter values selected for a blob size range of the plurality of blob size ranges associated with a second value of the source data metric value.

23. The method of claim 22, wherein the storing the source data on the plurality of storage nodes using the erasure code parameterized with data coding parameter values based at least in part on the first storage node read unit size comprises:
dynamically determining how blobs of source data are encoded as the erasure coded fragments using different data coding parameters depending upon the source data metric for source data of a respective blob size range of the plurality of blob size ranges and the first storage node read unit size.

24. The method of claim 22, wherein the source data metric value comprises one or more source data metrics selected from the group consisting of a size of a group of application data chunks of the source data that are typically accessed together, a type of data of the source data, and data access priority for the source data.

25. The method of claim 1, wherein the data coding parameters further comprise a number c of fragments stored per storage node and a symbol size Ssize, wherein the values c and Ssize are selected so that c times Ssize is at least a significant fraction of the first storage node read unit size value.

26. An apparatus for storing source data as a plurality of erasure coded fragments on storage nodes of a storage system, the apparatus comprising:
one or more data processors; and
one or more non-transitory computer-readable storage media containing program code configured to cause the one or more data processors to perform operations including:
obtaining storage device metric values for a storage node configuration of a plurality of storage nodes of the storage nodes of the storage system, wherein the storage device metric values for the storage node configuration include a storage node read unit size value, a target storage overhead value, and a plurality of blob size ranges corresponding to groups of application data chunks that are accessed together;
encoding the source data to provide erasure coded fragments for storage on storage nodes of the storage system having the storage node configuration using an erasure code parameterized with data coding parameter values including a number of storage nodes from which a blob of source data in a respective blob size range of the plurality of blob size ranges can be recovered value and an erasure code symbol overhead value based at least in part on the storage device metric values for the respective blob size range, wherein the data coding parameter values are selected for the respective blob size range to provide the erasure coded fragments configured for I/O access efficiency measured as an amount of data read from the storage nodes to access a given portion of source data, and wherein the erasure code symbol overhead value is selected to be large enough to ensure rapid decoding of the blob of source data from a number of fragments equal to the number of storage nodes from which blobs of source data are recovered value or to be large enough to ensure high reliability decoding of the blob of source data from a number of fragments equal to the number of storage nodes from which blobs of source data are recovered value; and
storing the erasure coded fragments of the source data on storage nodes of the plurality of storage nodes, wherein the erasure coded fragments are configured to facilitate the I/O access providing I/O access efficiency in the storage system using the erasure code parameterized with the data coding parameter values for the respective blob size range for blobs of source data identified in the source data.

27. The apparatus of claim 26, wherein the data coding parameter values are selected for blob size ranges of the plurality of blob size ranges, wherein the data coding parameter values for a blob size range of the blob size ranges comprises a total number of storage nodes storing data for blobs within the blob size range of the plurality of blob size ranges.

28. The apparatus of claim 27, wherein source data metric values are associated with the source data, wherein the data coding parameter values selected for a first blob size range of the plurality of blob size ranges associated with first source data metric values is different than the data coding parameter values selected for a second blob size range of the blob size ranges associated with second source data metric values, wherein the first source data metric values and the second source data metric values are different.

29. The apparatus of claim 27, wherein source data metric values are associated with the source data, wherein the source data metric values associated with the source data comprise a respective blob size corresponding to application data chunks that are accessed together.

30. The apparatus of claim 26, wherein source data metric values are associated with the source data, wherein different sets of values for a first set of the data coding parameter values are provided for a blob size range of the plurality of blob size ranges corresponding to a respective one of the source data metric values than for chunks of the source data corresponding to other respective ones of the source data metric values, and wherein a same set of values for a second set of the data coding parameter values are provided for the blob size range corresponding to the respective one of a plurality of source data metrics as for the blob size ranges corresponding to the other respective ones of the source data metric values.

31. The apparatus of claim 30, wherein the plurality of source data metrics comprise a plurality of efficient access block sizes for the chunks of source data.

32. The apparatus of claim 31, wherein an efficient access block size of the plurality of efficient access block sizes is determined for a respective blob size range of the plurality of blob size ranges based on a typical size of data accessed within the source data.

33. The apparatus of claim 30, wherein the first set of data coding parameters comprise a number of fragments stored per storage node value.

34. The apparatus of claim 33, wherein the second set of data coding parameters comprise a number of source symbols used by the erasure code value, wherein the number of source symbols used by the erasure code is a minimal number of fragments needed to recover blobs of source data.

35. The apparatus of claim 34, wherein the first set of data coding parameters comprise a number of storage nodes from which a blob of source data in a respective blob size range of the plurality of blob size ranges can be recovered value, wherein the second set of data coding parameters further comprise the erasure code symbol overhead value, wherein a sum of the erasure code symbol overhead value and the number of source symbols used by the erasure code value is equal to a number of storage nodes from which the blob of source data are recovered value.

36. The apparatus of claim 35, wherein the erasure code symbol overhead value is selected to be a small fraction of the number of source symbols used by the erasure code value.

37. The apparatus of claim 30, wherein the first set of data coding parameters comprise the number of storage nodes from which a blob of source data in a respective blob size range of the plurality of blob size ranges can be recovered value.

38. The apparatus of claim 30, wherein the first set of data coding parameters comprise a number of storage nodes on which data for a blob of source data in a respective blob size range of the plurality of blob size ranges is stored value.

39. The apparatus of claim 26, wherein the operations performed by the one or more data processors further includes:
obtaining the plurality of blob size ranges for storage of the erasure coded fragments within the storage system, wherein each blob size range of the plurality of blob size ranges has respective data coding parameter values for use in generating erasure coded fragments from blobs of source data having a size corresponding to a respective blob size range of the plurality of blob size ranges, wherein a same set of values for a plurality of the data coding parameter values are used for different blob size ranges of the plurality of blob size ranges.

40. The apparatus of claim 39, wherein the storage device metric values comprise a storage node read unit size.

41. The apparatus of claim 40, wherein the data coding parameter values further comprise a number of fragments stored per storage node value, wherein the number of fragments per storage node value are different for a first blob size range and a second blob size range of the plurality of blob size ranges.

42. The apparatus of claim 41, wherein the number of fragments per storage node value for blobs in the blob size range for at least one blob size range of the plurality of blob size ranges is selected to provide emulation of a maximum distance separable (MDS) erasure code for an erasure code that is not inherently MDS.

43. The apparatus of claim 40, wherein a first storage node read unit size of the storage device metric values comprises an efficient read unit of data from storage nodes of the storage node configuration.

44. The apparatus of claim 43, wherein the operations performed by the one or more data processors further includes:
obtaining at least one storage metric value associated with the storing of the source data as the plurality of erasure coded fragments in addition to the first storage node read unit size, wherein the data coding parameter values are parameterized based at least in part on the first storage node read unit size and the at least one storage metric value.

45. The apparatus of claim 44, wherein the at least one storage metric value includes a storage device metric value in addition to the first storage node read unit size, wherein the data coding parameter values selected for a blob of source data associated with a first value of the storage device metric value is different than the data coding parameter values selected for a blob of source data associated with a second value of the storage device metric values.

46. The apparatus of claim 45, wherein the storage device metric value comprises one or more storage device metric values selected from the group consisting of a target storage overhead and a second storage node read unit size for a second storage node configuration of storage nodes of the storage system.

47. The apparatus of claim 44, wherein the at least one storage metric value includes a source data metric value for source data stored by the storage system, wherein the data coding parameter values selected for a blob size range of the plurality of blob size ranges associated with a first value of the source data metric value is different than the data coding parameter values selected for a blob size range of the plurality of blob size ranges associated with a second value of the source data metric value.

48. The apparatus of claim 47, wherein the storing the source data on the plurality of storage nodes using the erasure code parameterized with data coding parameter values based at least in part on the first storage node read unit size comprises:
dynamically determining how blobs of source data are encoded as the erasure coded fragments using different data coding parameters depending upon the source data metric for source data of a respective blob size range of the plurality of blob size ranges and the first storage node read unit size.

49. The apparatus of claim 47, wherein the source data metric value comprises one or more source data metrics selected from the group consisting of a size of a group of application data chunks of the source data that are typically accessed together, a type of data of the source data, and data access priority for the source data.

50. The apparatus of claim 26, wherein the data coding parameters further comprise a number c of fragments stored per storage node and a symbol size Ssize, wherein the values c and Ssize are selected so that c times Ssize is at least a significant fraction of the first storage node read unit size value.

51. An apparatus for storing source data as a plurality of erasure coded fragments on storage nodes of a storage system, the apparatus comprising:
means for obtaining storage device metric values for a storage node configuration of a plurality of storage nodes of the storage nodes of the storage system, wherein the storage device metric values for the storage node configuration include a storage node read unit size value, a target storage overhead value, and a plurality of blob size ranges corresponding to groups of application data chunks that are accessed together;
means for encoding the source data to provide erasure coded fragments for storage on storage nodes of the storage system having the storage node configuration using an erasure code parameterized with data coding parameter values including a number of storage nodes from which a blob of source data in a respective blob size range of the plurality of blob size ranges can be recovered value and an erasure code symbol overhead value based at least in part on the storage device metric values for the respective blob size range, wherein the data coding parameter values are selected for the respective blob size range to provide the erasure coded fragments configured for I/O access efficiency measured as an amount of data read from the storage nodes to access a given portion of source data, and wherein the erasure code symbol overhead value is selected to be large enough to ensure rapid decoding of the blob of source data from a number of fragments equal to the number of storage nodes from which blobs of source data are recovered value or to be large enough to ensure high reliability decoding of the blob of source data from a number of fragments equal to the number of storage nodes from which blobs of source data are recovered value; and means for storing the erasure coded fragments of the source data on storage nodes of the plurality of storage nodes, wherein the erasure coded fragments are configured to facilitate the I/O access providing I/O access efficiency in the storage system using the erasure code parameterized with the data coding parameter values for the respective blob size range for blobs of source data identified in the source data.

52. The apparatus of claim 51, wherein the data coding parameter values are selected for blob size ranges of the plurality of blob size ranges, wherein the data coding parameter values for a blob size range of the blob size ranges comprises a total number of storage nodes storing data for blobs within the blob size range of the plurality of blob size ranges.

53. The apparatus of claim 52, wherein source data metric values are associated with the source data, wherein the data coding parameter values selected for a first blob size range of the plurality of blob size ranges associated with first source data metric values is different than the data coding parameter values selected for a second blob size range of the blob size ranges associated with second source data metric values, wherein the first source data metric values and the second source data metric values are different.

54. The apparatus of claim 52, wherein source data metric values are associated with the source data, wherein the source data metric values associated with the source data comprise a respective blob size corresponding to application data chunks that are accessed together.

55. The apparatus of claim 51, wherein source data metric values are associated with the source data, wherein different sets of values for a first set of the data coding parameter values are provided for a blob size range of the plurality of blob size ranges corresponding to a respective one of the source data metric values than for blob size ranges of the plurality of blob size ranges corresponding to other respective ones of the source data metric values, and wherein a same set of values for a second set of the data coding parameter values are provided for the blob size range corresponding to the respective one of a plurality of source data metrics as for the blob size ranges corresponding to the other respective ones of the source data metric values.

56. The apparatus of claim 55, wherein the plurality of source data metrics comprise a plurality of efficient access block sizes for the chunks of source data.

57. The apparatus of claim 56, wherein an efficient access block size of the plurality of efficient access block sizes is determined for a respective blob size range of the plurality of blob size ranges based on a typical size of data accessed within the source data.

58. The apparatus of claim 55, wherein the first set of data coding parameters comprise a number of fragments stored per storage node value.

59. The apparatus of claim 58, wherein the second set of data coding parameters comprise a number of source symbols used by the erasure code value, wherein the number of source symbols used by the erasure code is a minimal number of fragments needed to recover blobs of source data.

60. The apparatus of claim 59, wherein the first set of data coding parameters comprise a number of storage nodes from which a blob of source data in a respective blob size range of the plurality of blob size ranges can be recovered value, wherein the second set of data coding parameters further comprise the erasure code symbol overhead value, wherein a sum of the erasure code symbol overhead value and the number of source symbols used by the erasure code value is equal to a number of storage nodes from which the blob of source data are recovered value.

61. The apparatus of claim 60, wherein the erasure code symbol overhead value is selected to be a small fraction of the number of source symbols used by the erasure code value.

62. The apparatus of claim 55, wherein the first set of data coding parameters comprise the number of storage nodes from which a blob of source data in a respective blob size range of the plurality of blob size ranges can be recovered value.

63. The apparatus of claim 55, wherein the first set of data coding parameters comprise a number of storage nodes on which data for a blob of source data in a respective blob size range of the plurality of blob size ranges is stored value.

64. The apparatus of claim 51, further comprising:
means for obtaining the plurality of blob size ranges for storage of the erasure coded fragments within the storage system, wherein each blob size range of the plurality of blob size ranges has respective data coding parameter values for use in generating erasure coded fragments from blobs of source data having a size corresponding to a respective blob size range of the plurality of blob size ranges, wherein a same set of values for a plurality of the data coding parameter values are used for different blob size ranges of the plurality of blob size ranges.

65. The apparatus of claim 64, wherein the storage device metric values comprise a storage node read unit size.

66. The apparatus of claim 65, wherein the data coding parameter values further comprise a number of fragments stored per storage node value, wherein the number of fragments per storage node value are different for a first blob size range and a second blob size range of the plurality of blob size ranges.

67. The apparatus of claim 66, wherein the number of fragments per storage node value for blobs in the blob size range for at least one blob size range of the plurality of blob size ranges is selected to provide emulation of a maximum distance separable (MDS) erasure code for an erasure code that is not inherently MDS.

68. The apparatus of claim 65, wherein a first storage node read unit size of the storage device metric values comprises an efficient read unit of data from storage nodes of the storage node configuration.

69. The apparatus of claim 68, further comprising:
means for obtaining at least one storage metric value associated with the storing of the source data as the plurality of erasure coded fragments in addition to the first storage node read unit size, wherein the data coding parameter values are parameterized based at least in part on the first storage node read unit size and the at least one storage metric value.

70. The apparatus of claim 69, wherein the at least one storage metric value includes a storage device metric value in addition to the first storage node read unit size, wherein the data coding parameter values selected for a blob of source data associated with a first value of the storage device metric value is different than the data coding parameter values selected for a blob of source data associated with a second value of the storage device metric values.

71. The apparatus of claim 70, wherein the storage device metric value comprises one or more storage device metric values selected from the group consisting of a target storage overhead and a second storage node read unit size for a second storage node configuration of storage nodes of the storage system.

72. The apparatus of claim 69, wherein the at least one storage metric value includes a source data metric value for source data stored by the storage system, wherein the data coding parameter values selected for a blob size range of the plurality of blob size ranges associated with a first value of the source data metric value is different than the data coding parameter values selected for a blob size range of the plurality of blob size ranges associated with a second value of the source data metric value.

73. The apparatus of claim 72, wherein the means for storing the source data on the plurality of storage nodes using the erasure code parameterized with data coding parameter values based at least in part on the first storage node read unit size comprises:
    means for dynamically determining how blobs of source data are encoded as the erasure coded fragments using different data coding parameters depending upon the source data metric for source data of a respective blob size range of the plurality of blob size ranges and the first storage node read unit size.

74. The apparatus of claim 72, wherein the source data metric value comprises one or more source data metrics selected from the group consisting of a size of a group of application data chunks of the source data that are typically accessed together, a type of data of the source data, and data access priority for the source data.

75. The apparatus of claim 51, wherein the data coding parameters further comprise a number c of fragments stored per storage node and a symbol size Ssize, wherein the values c and Ssize are selected so that c times Ssize is at least a significant fraction of the first storage node read unit size value.

76. A non-transitory computer-readable medium comprising codes for storing source data as a plurality of erasure coded fragments on storage nodes of a storage system, the codes causing the computer to:
    obtain storage device metric values for a storage node configuration of a plurality of storage nodes of the storage nodes of the storage system, wherein the storage device metric values for the storage node configuration include a storage node read unit size value, a target storage overhead value, and a plurality of blob size ranges corresponding to groups of application data chunks that are accessed together;
    encode the source data to provide erasure coded fragments for storage on storage nodes of the storage system having the storage node configuration using an erasure code parameterized with data coding parameter values including a number of storage nodes from which a blob of source data in a respective blob size range of the plurality of blob size ranges can be recovered value and an erasure code symbol overhead value based at least in part on the storage device metric values for the respective blob size range, wherein the data coding parameter values are selected for the respective blob size range to provide the erasure coded fragments configured for I/O access efficiency measured as an amount of data read from the storage nodes to access a given portion of source data, and wherein the erasure code symbol overhead value is selected to be large enough to ensure rapid decoding of the blob of source data from a number of fragments equal to the number of storage nodes from which blobs of source data are recovered value or to be large enough to ensure high reliability decoding of the blob of source data from a number of fragments equal to the number of storage nodes from which blobs of source data are recovered value; and
    store the erasure coded fragments of the source data on storage nodes of the plurality of storage nodes, wherein the erasure coded fragments are configured to facilitate the I/O access providing I/O access efficiency in the storage system using the erasure code parameterized with the data coding parameter values for the respective blob size range for blobs of source data identified in the source data.

77. The non-transitory computer-readable medium of claim 76, wherein the data coding parameter values are selected for blob size ranges of the plurality of blob size ranges, wherein the data coding parameter values for a blob size range of the blob size ranges comprises a total number of storage nodes storing data for blobs within the blob size range of the plurality of blob size ranges.

78. The non-transitory computer-readable medium of claim 77, wherein source data metric values are associated with the source data, wherein the data coding parameter values selected for a first blob size range of the plurality of blob size ranges associated with first source data metric values is different than the data coding parameter values selected for a second blob size range of the blob size ranges associated with second source data metric values, wherein the first source data metric values and the second source data metric values are different.

79. The non-transitory computer-readable medium of claim 77, wherein source data metric values are associated with the source data, wherein the source data metric values associated with the source data comprise a respective blob size corresponding to application data chunks that are accessed together.

80. The non-transitory computer-readable medium of claim 76, wherein source data metric values are associated with the source data, wherein different sets of values for a first set of the data coding parameter values are provided for a blob size range of the plurality of blob size ranges corresponding to a respective one of the source data metric values than for blob size ranges of the plurality of blob size ranges corresponding to other respective ones of the source data metric values, and wherein a same set of values for a second set of the data coding parameter values are provided for the blob size range corresponding to the respective one of a plurality of source data metrics as for the blob size ranges corresponding to the other respective ones of the source data metric values.

81. The non-transitory computer-readable medium of claim 80, wherein the plurality of source data metrics comprise a plurality of efficient access block sizes for the chunks of source data.

82. The non-transitory computer-readable medium of claim 81, wherein an efficient access block size of the plurality of efficient access block sizes is determined for a respective blob size range of the plurality of blob size ranges based on a typical size of data accessed within the source data.

83. The non-transitory computer-readable medium of claim 80, wherein the first set of data coding parameters comprise a number of fragments stored per storage node value.

84. The non-transitory computer-readable medium of claim 83, wherein the second set of data coding parameters comprise a number of source symbols used by the erasure code value, wherein the number of source symbols used by the erasure code is a minimal number of fragments needed to recover blobs of source data.

85. The non-transitory computer-readable medium of claim 84, wherein the first set of data coding parameters comprise a number of storage nodes from which a blob of source data in a respective blob size range of the plurality of blob size ranges can be recovered value, wherein the second set of data coding parameters further comprise the erasure code symbol overhead value, wherein a sum of the erasure code symbol overhead value and the number of source symbols used by the erasure code value is equal to a number of storage nodes from which the blob of source data are recovered value.

86. The non-transitory computer-readable medium of claim 85, wherein the erasure code symbol overhead value is selected to be a small fraction of the number of source symbols used by the erasure code value.

87. The non-transitory computer-readable medium of claim 80, wherein the first set of data coding parameters comprise the number of storage nodes from which a blob of source data in a respective blob size range of the plurality of blob size ranges can be recovered value.

88. The non-transitory computer-readable medium of claim 80, wherein the first set of data coding parameters comprise a number of storage nodes on which data for a blob of chunk of source data in a respective blob size range of the plurality of blob size ranges is stored value.

89. The non-transitory computer-readable medium of claim 76, wherein the codes further cause the computer to:
obtain the plurality of blob size ranges for storage of the erasure coded fragments within the storage system, wherein each blob size range of the plurality of blob size ranges has respective data coding parameter values for use in generating erasure coded fragments from blobs of source data having a size corresponding to a respective blob size range of the plurality of blob size ranges, wherein a same set of values for a plurality of the data coding parameter values are used in the implementing data coding parameters for different blob size ranges of the plurality of blob size ranges.

90. The non-transitory computer-readable medium of claim 89, wherein the storage device metric values comprise a storage node read unit size.

91. The non-transitory computer-readable medium of claim 90, wherein the data coding parameter values further comprise a number of fragments stored per storage node value, wherein the number of fragments per storage node value are different for a first blob size range and a second blob size range of the plurality of blob size ranges.

92. The non-transitory computer-readable medium of claim 91, wherein the number of fragments per storage node value for blobs in the blob size range for at least one blob size range of the plurality of blob size ranges is selected to provide emulation of a maximum distance separable (MDS) erasure code for an erasure code that is not inherently MDS.

93. The non-transitory computer-readable medium of claim 90, wherein a first storage node read unit size of the storage device metric values comprises an efficient read unit of data from storage nodes of the storage node configuration.

94. The non-transitory computer-readable medium of claim 93, wherein the codes further cause the computer to:
obtain at least one storage metric value associated with the storing of the source data as the plurality of erasure coded fragments in addition to the first storage node read unit size, wherein the data coding parameter values are parameterized based at least in part on the first storage node read unit size and the at least one storage metric value.

95. The non-transitory computer-readable medium of claim 94, wherein the at least one storage metric value includes a storage device metric value in addition to the first storage node read unit size, wherein the data coding parameter values selected for a blob of source data associated with a first value of the storage device metric value is different than the data coding parameter values selected for a blob of source data associated with a second value of the storage device metric values.

96. The non-transitory computer-readable medium of claim 95, wherein the storage device metric value comprises one or more storage device metric values selected from the group consisting of a target storage overhead and a second storage node read unit size for a second storage node configuration of storage nodes of the storage system.

97. The non-transitory computer-readable medium of claim 94, wherein the at least one storage metric value includes a source data metric value for source data stored by the storage system, wherein the data coding parameter values selected for a blob size range of the plurality of blob size ranges associated with a first value of the source data metric value is different than the data coding parameter values selected for a blob size range of the plurality of blob size ranges associated with a second value of the source data metric value.

98. The non-transitory computer-readable medium of claim 97, wherein the codes causing the computer to implement the data coding parameter values using the erasure code based at least in part on the first storage node read unit size further cause the computer to:
dynamically determine how blobs of source data are encoded as the erasure coded fragments using different data coding parameters depending upon the source data metric for source data of a respective blob size range of the plurality of blob size ranges and the first storage node read unit size.

99. The non-transitory computer-readable medium of claim 97, wherein the source data metric value comprises one or more source data metrics selected from the group consisting of a size of a group of application data chunks of the source data that are typically accessed together, a type of data of the source data, and data access priority for the source data.

100. The non-transitory computer-readable medium of claim 76, wherein the data coding parameters further comprise a number c of fragments stored per storage node and a symbol size Ssize, wherein the values c and Ssize are selected so that c times Ssize is at least a significant fraction of the first storage node read unit size value.

* * * * *